US012685136B2

(12) United States Patent
Xie et al.

(10) Patent No.: US 12,685,136 B2
(45) Date of Patent: Jul. 14, 2026

(54) INTERCONNECT THROUGH GATE CUT FOR STACKED FET DEVICE

(71) Applicant: INTERNATIONAL BUSINESS MACHINES CORPORATION, Armonk, NY (US)

(72) Inventors: Ruilong Xie, Niskayuna, NY (US); Albert M. Young, Fishkill, NY (US); Brent A. Anderson, Jericho, VT (US); Julien Frougier, Albany, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 17/664,887

(22) Filed: May 25, 2022

(65) Prior Publication Data

US 2023/0387007 A1 Nov. 30, 2023

(51) Int. Cl.
| | |
|---|---|
| *H10W 20/41* | (2026.01) |
| *H10D 30/67* | (2025.01) |
| *H10D 62/10* | (2025.01) |

(52) U.S. Cl.
CPC ...... *H10W 20/435* (2026.01); *H10D 30/6713* (2025.01); *H10D 30/6757* (2025.01); *H10D 62/118* (2025.01)

(58) Field of Classification Search
CPC ........... H01L 23/5283; H01L 21/76895; H01L 23/5286; H10D 30/6713; H10D 30/6757; H10D 62/118; H10D 30/6728; H10D 30/43; H10D 64/017; H10D 30/014; H10D 62/121; H10D 62/151; H10D 84/0153; H10D 84/0149; H10D 84/038; H10D 84/83; H10D 88/00; H10D 88/01; B82Y 10/00
See application file for complete search history.

(56) References Cited

U.S. PATENT DOCUMENTS

| | | | |
|---|---|---|---|
| 7,687,834 B2 | 3/2010 | Kapoor | |
| 7,855,403 B2 | 12/2010 | Bertin | |
| 7,855,455 B2 | 12/2010 | Purushothaman | |
| 8,093,099 B2 | 1/2012 | Purushothaman | |
| 8,124,525 B1 | 2/2012 | Koburger, III | |
| 9,064,717 B2 | 6/2015 | Purushothaman | |
| 9,659,963 B2 | 5/2017 | Cheng | |

(Continued)

OTHER PUBLICATIONS

McLellan, "ITF: CFETs and New Interconnect", Aug. 2, 2018, pp. 1-7.

(Continued)

*Primary Examiner* — Britt Hanley
*Assistant Examiner* — William C. Trice, III
(74) *Attorney, Agent, or Firm* — Samuel A. Waldbaum

(57) ABSTRACT

A microelectronic structure including a stacked device region, where stacked device region is comprised of a plurality of top devices and a plurality of bottom devices. Each of the plurality of top devices includes at least one top source/drain. Each of the plurality of bottom devices includes at least one bottom source/drain. A gate cut region located adjacent to the stacked region and an interconnect located in the gate cut region. The interconnect is connected to at least two different devices located in the stacked device region.

20 Claims, 41 Drawing Sheets

(56) References Cited

U.S. PATENT DOCUMENTS

| | | | |
|---|---|---|---|
| 9,831,306 B2 | 11/2017 | Webb | |
| 9,837,414 B1 | 12/2017 | Balakrishnan | |
| 10,192,867 B1 | 1/2019 | Frougier | |
| 10,256,158 B1 | 4/2019 | Frougier | |
| 2002/0036347 A1 | 3/2002 | Houston | |
| 2017/0084723 A1 | 3/2017 | Greene | |
| 2018/0025968 A1* | 1/2018 | Liu | H10D 64/017 |
| | | | 257/E21.409 |
| 2020/0381430 A1 | 12/2020 | Liebmann | |
| 2021/0118798 A1 | 4/2021 | Liebmann | |
| 2021/0249401 A1 | 8/2021 | Shiraki | |
| 2021/0408285 A1* | 12/2021 | Hickey | H10D 64/017 |
| 2023/0087444 A1* | 3/2023 | Thomson | H10D 64/017 |
| | | | 257/351 |

OTHER PUBLICATIONS

Sperling, "Big Changes In Tiny Interconnects", Apr. 16, 2020, https://semiengineering.com/big-changes-in-tiny-interconnects/, pp. 1-8.

* cited by examiner 140
130
126
128 } 122
124
120
116
118 } 112
114
110
105
165
160
155
150    145

185
170
170
165
155
155
110
105
150

335
340
330

322 {
325
318
330

320

312 {
315
318
330

310

305

370

310

305

335
340
330
322 { 325
      318
      330
320
312 { 315
      318
      330
360
355
350
345
310
305

370
380
310
305

INTERCONNECT THROUGH GATE CUT FOR STACKED FET DEVICE

BACKGROUND

The present invention generally relates to the field of microelectronic, and more particularly to formation of an interconnected located in a gate cut, where the interconnected connects at least two components on different devices.

Nanosheet is the lead device architecture in continuing CMOS scaling. However, nanosheet technology has shown issues when scaling down such that as the devices become smaller and closer together, they are interfering with each other. Furthermore, as the devices become smaller it becomes difficult to form the connections between different devices.

BRIEF SUMMARY

Additional aspects and/or advantages will be set forth in part in the description which follows and, in part, will be apparent from the description, or may be learned by practice of the invention.

A microelectronic structure including a stacked device region, where stacked device region is comprised of a plurality of top devices and a plurality of bottom devices. Each of the plurality of top devices includes at least one top source/drain. Each of the plurality of bottom devices includes at least one bottom source/drain. A gate cut region located adjacent to the stacked region and an interconnect located in the gate cut region. The interconnect is connected to at least two different devices located in the stacked device region.

A microelectronic device including a first stacked device region. The first stacked device region is comprised of a plurality of first top devices and a first plurality of bottom devices. Each of the plurality of first top devices includes at least one first top source/drain, and where each of the plurality of first bottom devices includes at least one first bottom source/drain. A second stacked device region, where the second stacked device region is comprised of a plurality of second top devices and a second plurality of bottom devices. Each of the plurality of second top devices includes at least one second top source/drain, and where each of the plurality of second bottom devices includes at least one second bottom source/drain. A gate cut region located between the first stacked region and the second stacked region. An interconnect located in the gate cut region, where the interconnect is connected to at least devices located in the first stacked device region and at least one device located in the second stacked device region.

A method including forming a first stacked device region, where the first stacked device region is comprised of a plurality of first top devices and a first plurality of bottom devices. Each of the plurality of first top devices includes at least one first top source/drain, and where each of the plurality of first bottom devices includes at least one first bottom source/drain. Forming a second stacked device region, where second stacked device region is comprised of a plurality of second top devices and a second plurality of bottom devices. Each of the plurality of second top devices includes at least one second top source/drain, and where each of the plurality of second bottom devices includes at least one second bottom source/drain. Forming a gate cut region located between the first stacked region and the second stacked region. Forming an interconnect located in the gate cut region, where the interconnect is connected to at least two different source/drains.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
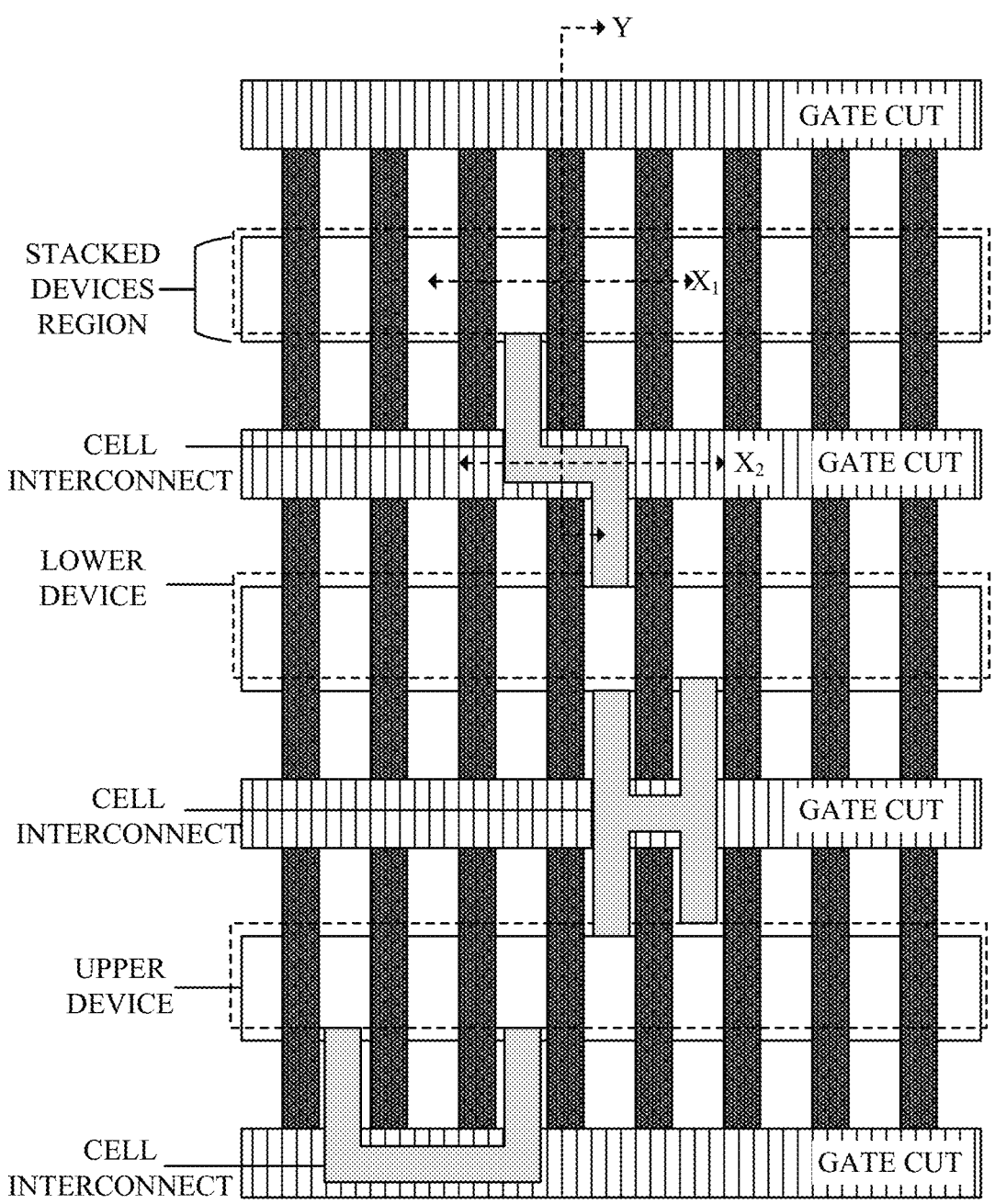
FIG. 1 illustrates a top-down view of stack devices separated by a gate cut having examples of cell interconnects, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semi-conductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed to forming an interconnect between stacked transistors, where the interconnect makes a connection between adjacent source/drains in the same cell, source/drains that are not adjacent to each other but located in the same cell, and source/drains located in different cells. The interconnect is located in a gate cut region that makes a connection between the different source/drains through the gate cut region. The interconnect can connect bottom to bottom, bottom to top, top to top, top to bottom, or bottom to bottom to top to top. The interconnect is able to make a connection between adjacent source/drains or the interconnect can make a connection between source/drains that are separated by a distance. There can be more than one interconnect connected to a group of stacked devices.

FIG. 1 illustrates a top-down view of stack devices separated by a gate cut having examples of cell interconnects, in accordance with the embodiment of the present invention. The present invention is comprised of one or more stacked devices, having a lower device and an upper device. The stacked devices are separated from adjacent stack devices by a gate cut filled with a dielectric material. FIG. 1 illustrates examples of cell interconnects that are comprised of a conductive metal, where the cell interconnects are located within the gate cut. The cell interconnect makes a connection between source/drain of the stacked devices within the same cell or between cells. The cell interconnect extends through a portion of the gate cut to form a connection between the different cells. One or more of the cell interconnects can be present in the stacked devices. Cross section $X_1$ extends through horizontal of the stacked devices region. Cross section $X_2$ extends through the horizontal of the gate cut, where the interconnect is at located. Cross section $Y_1$ is perpendicular to cross section $X_1$ and cross section $X_2$, where cross section $Y_1$ is through the gate region of the stacked devices.

Figures 2, 3:
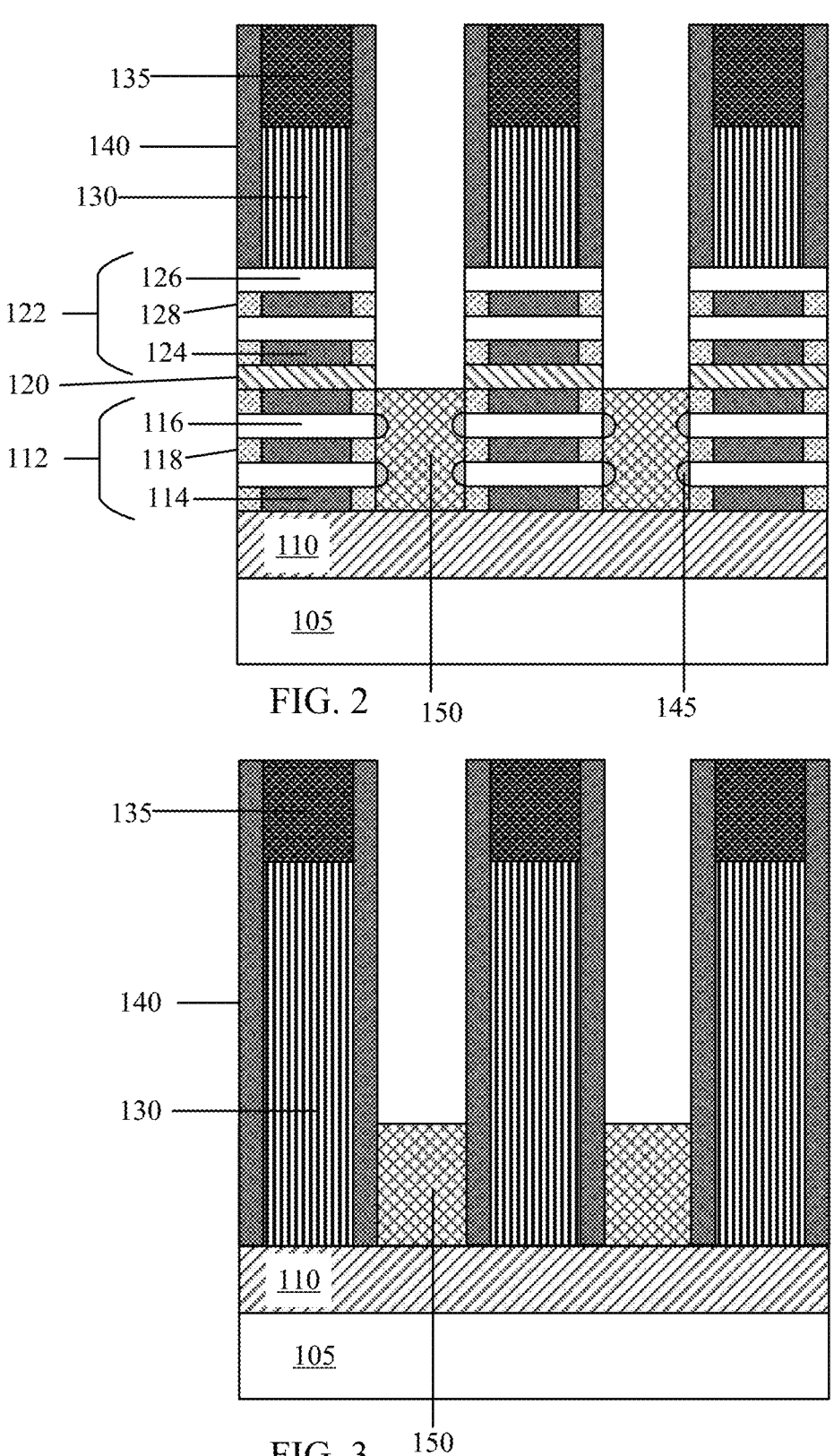
FIG. 2 illustrates a cross section $X_1$ of the stacked device region after the formation of bottom source/drain and a first placeholder, in accordance with the embodiment of the present invention.
FIG. 3 illustrates a cross section $X_2$ of the gate cut region after the formation of bottom source/drain and a first placeholder, in accordance with the embodiment of the present invention.

FIG. 2 illustrates a cross section $X_1$ of the stacked device region after the formation of bottom source/drain 145 and a first placeholder 150, in accordance with the embodiment of the present invention. The stacked nano device includes a substrate 105, an oxide layer 110, a bottom device 112, an isolation layer 120, an upper device 122, a bottom source/drain 145, and a first placeholder 150.

The substrate 105 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 may be doped, undoped or contain doped regions and undoped regions therein.

The bottom device 112 includes alternating layers of bottom sacrificial layer 114 and bottom nanosheets 116, and a bottom inner spacer 118 located in a spaced created by recessing of the bottom sacrificial layers 114. The bottom source/drain 145 extends from the sidewalls of the bottom nanosheets 116 into the space between sections of the bottom device 112. A first placeholder 150 is formed in the space between sections of the bottom device 112, where the first placeholder 150 is in direct contact with the bottom source/drain 145 and the bottom inner spacer 118. The first placeholder can be comprised of, for example, $TiO_x$. An isolation layer 120 is formed on top of the bottom device 112. The isolation layer 120 can be comprised of, for example, a dielectric material.

The bottom source/drain 145 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

An upper device 122 is formed on top of the isolation layer 120. The upper device 122 includes alternating layers of upper sacrificial layer 124 and upper nanosheet 126, and an upper inner spacer 128 located in a spaced created by recessing of the upper sacrificial layers 124. A dummy gate 130 is formed on top of the upper device 122. A hardmask 135 is formed on top of the dummy gate 130. Upper spacer 140 are located on the sidewalls of the dummy gate 130 and the hardmask 135.

FIG. 3 illustrates a cross section $X_2$ of the gate cut region after the formation of bottom source/drain 145 and a first placeholder 150, in accordance with the embodiment of the present invention. The gate cut region includes the substrate 105, the oxide layer 110, the dummy gate 130, the hardmask 135, the upper spacer 140, and the first placeholder 150. The columns of the dummy gate 130, hardmask 135, and the upper spacer 140 are separated by the first placeholder 150.

Figure 4:
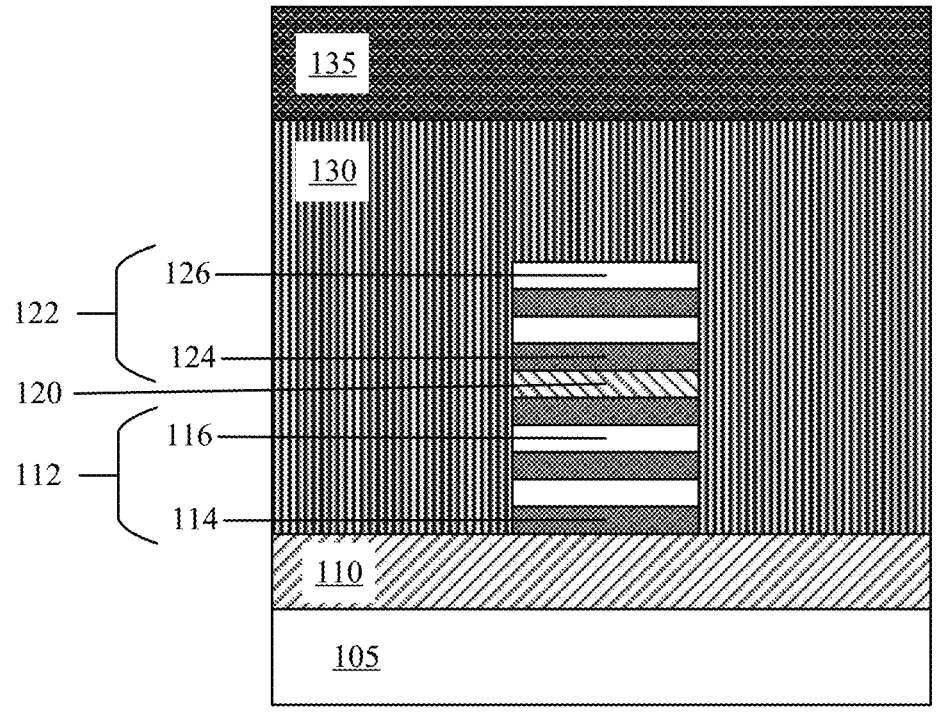
FIG. 4 illustrates a cross section $Y_1$ of the gate region after the formation of bottom source/drain and a first placeholder, in accordance with the embodiment of the present invention.

FIG. 4 illustrates a cross section $Y_1$ of the gate region after the formation of bottom source/drain and a first placeholder, in accordance with the embodiment of the present invention. The gate region includes the substrate 105, the oxide layer 110, the bottom device 112, the isolation layer 120, the upper device 122, the dummy gate 130, and the hardmask 135. The dummy gate 130 includes the stack of the bottom device 112, the isolation layer 120, and the upper device 122.

Figures 5, 6:
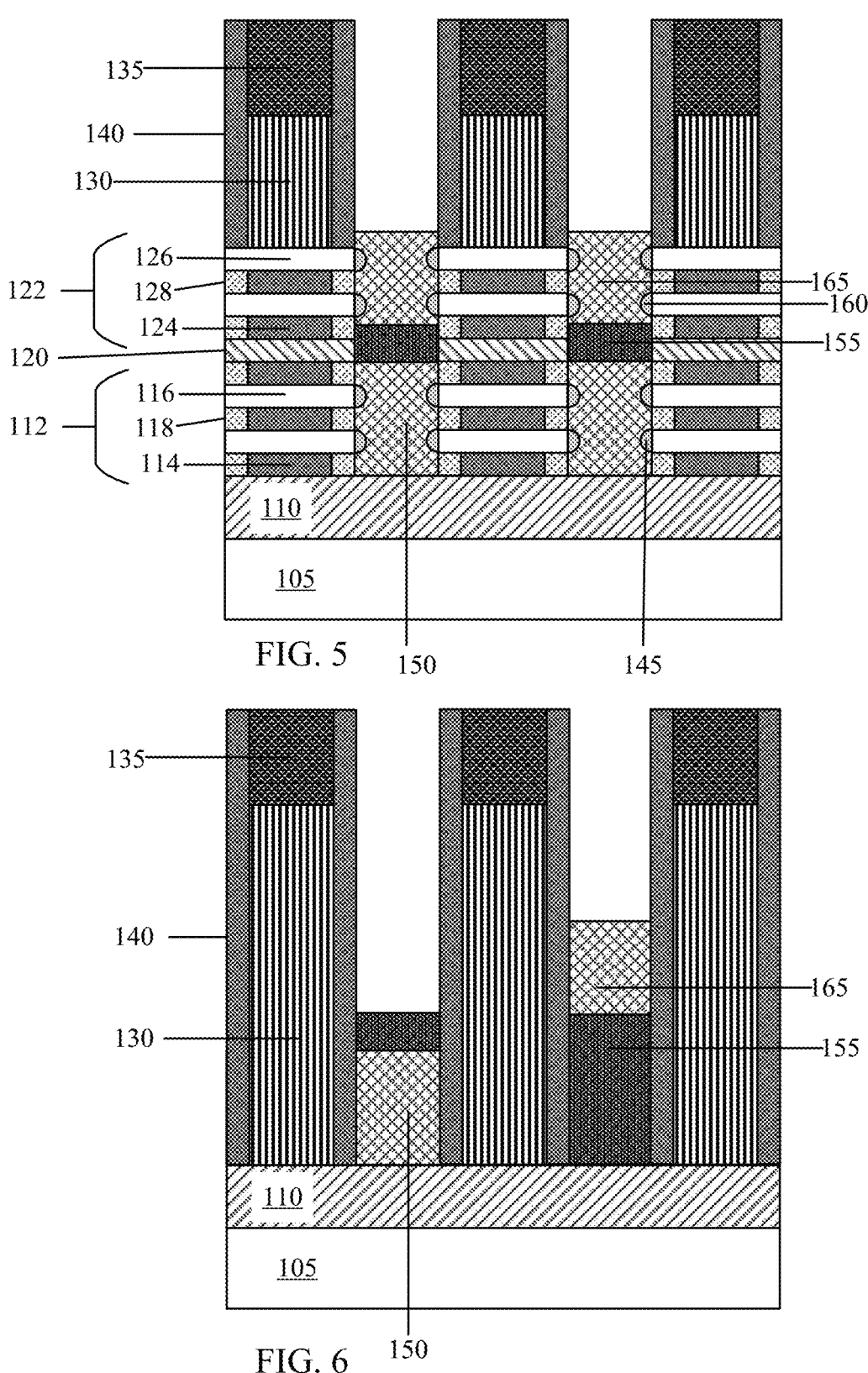
FIG. 5 illustrates a cross section $X_1$ of the stacked device region after the formation of a middle isolation layer, an upper source/drain and a second placeholder, in accordance with the embodiment of the present invention.
FIG. 6 illustrates a cross section $X_2$ of the gate cut region after the formation of a middle isolation layer, and a second placeholder, in accordance with the embodiment of the present invention.

FIGS. 5 and 6 illustrate the process stage after patterning the placeholder 150, and formation of a middle isolation layer 155, an upper source/drain 160 and a second placeholder 165, in accordance with the embodiment of the present invention. FIG. 5 illustrates a cross section $X_1$ of the stacked device region after patterning the first placeholder 150, the formation of a middle isolation layer 155, an upper source/drain 160 and a second placeholder 165, in accordance with the embodiment of the present invention. A middle isolation layer 155 is formed on top of the first placeholder 150. A second placeholder 165 is formed on top of the middle isolation layer 155. The second placeholder 165 can be comprised of, for example, $TiO_x$.

FIG. 6 illustrates a cross section $X_2$ of the gate cut region after patterning the first placeholder 150, and the formation of a middle isolation layer 155, and a second placeholder 165, in accordance with the embodiment of the present invention. A portion of the first placeholder 150 is removed by lithography and etching process. The arrangement of the first placeholder 150, the middle isolation layer 155, and the second placeholder 165 will determine the final arrangement for the interconnect, i.e., which source/drains the interconnect will make a connection to. For example, if the interconnect will have a bottom-to-bottom, bottom-to-top, top-to-bottom, or multiple connections are determined by the arrangement of the first placeholder 150, the middle isolation layer 155, and the second placeholder 165. As illustrated by FIG. 6, a portion of the first placeholder 150 is removed and replaced with the middle isolation layer 155. The second placeholder 165 is formed on top of the middle isolation layer 155 and patterned by lithography and etching process so that only a portion of the second placeholder 165 remains. For example, the configuration of the first placeholder 150, the middle isolation layer 155, and the second placeholder 165 will lead to an interconnect having a bottom-to-top configuration. The configuration of the interconnect that is illustrated by the Figures is not meant to be limiting, and different configures of the interconnect are possible.

Figure 7:
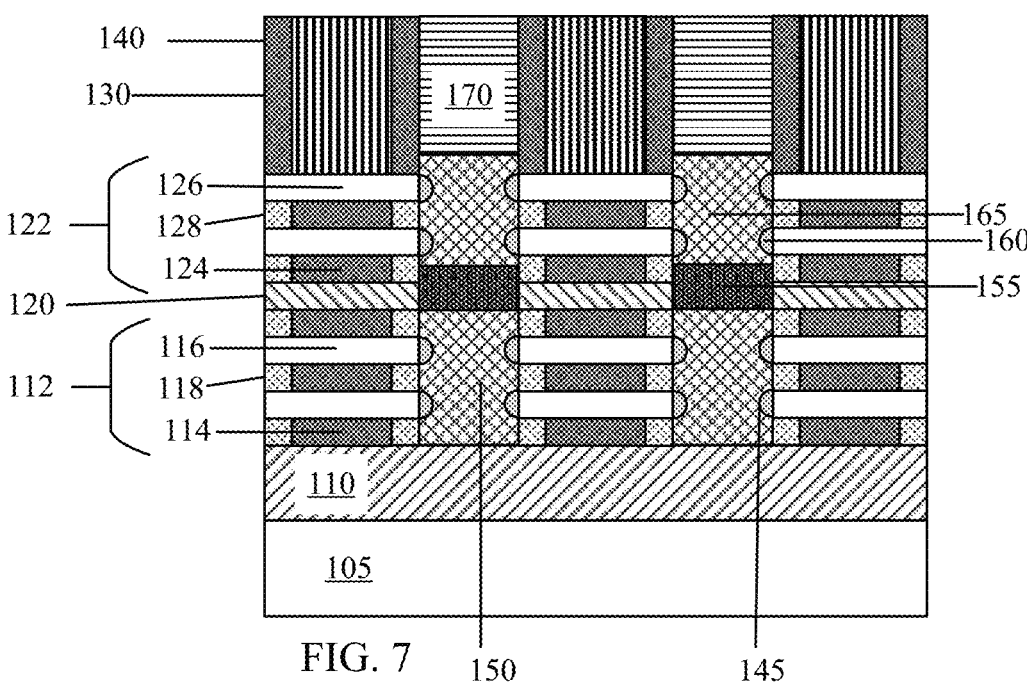
FIG. 7 illustrates a cross section $X_1$ of the stacked device region after the formation of an interlayer dielectric, in accordance with the embodiment of the present invention.
Figure 8:
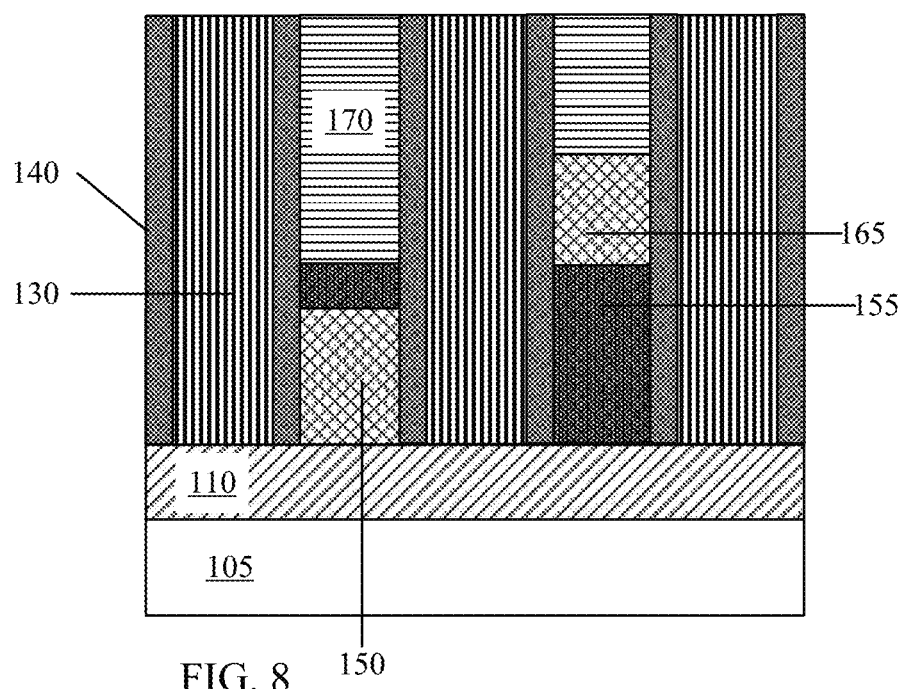
FIG. 8 illustrates a cross section $X_2$ of the gate cut region after the formation of an interlayer dielectric, in accordance with the embodiment of the present invention.

FIGS. 7 and 8 illustrate the process stage after formation of an interlayer dielectric 170, in accordance with the embodiment of the present invention. FIG. 7 illustrates a cross section $X_1$ of the stacked device region after the formation of an interlayer dielectric 170, in accordance with the embodiment of the present invention. FIG. 8 illustrates a cross section $X_2$ of the gate cut region after the formation of an interlayer dielectric, in accordance with the embodiment of the present invention. An interlayer dielectric 170 is formed on top of the second placeholder 165. Furthermore, the interlayer dielectric 170 can be formed on top of the middle isolation layer 155, as illustrated by FIG. 8. When the design for the interconnect will have a top-to-top connection, then the interlayer dielectric 170 is located top of the second placeholder 165 not on top of the middle isolation layer 155 at the location of the interconnect.

Figure 9:
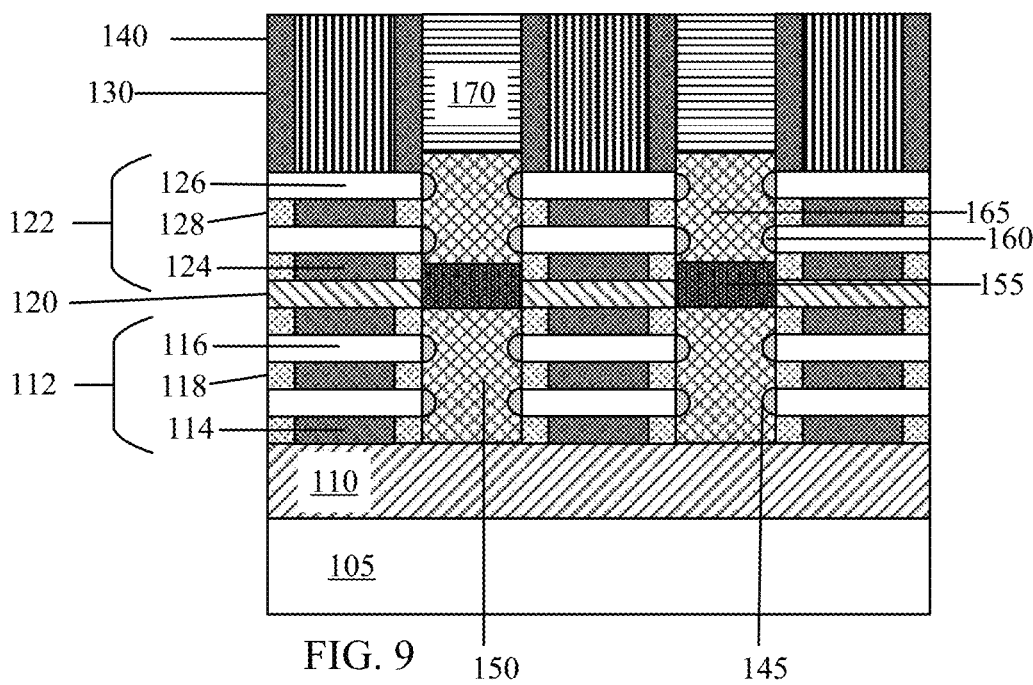
FIG. 9 illustrates a cross section $X_1$ of the stacked device region after the formation of a gate cut, in accordance with the embodiment of the present invention.
Figure 10:
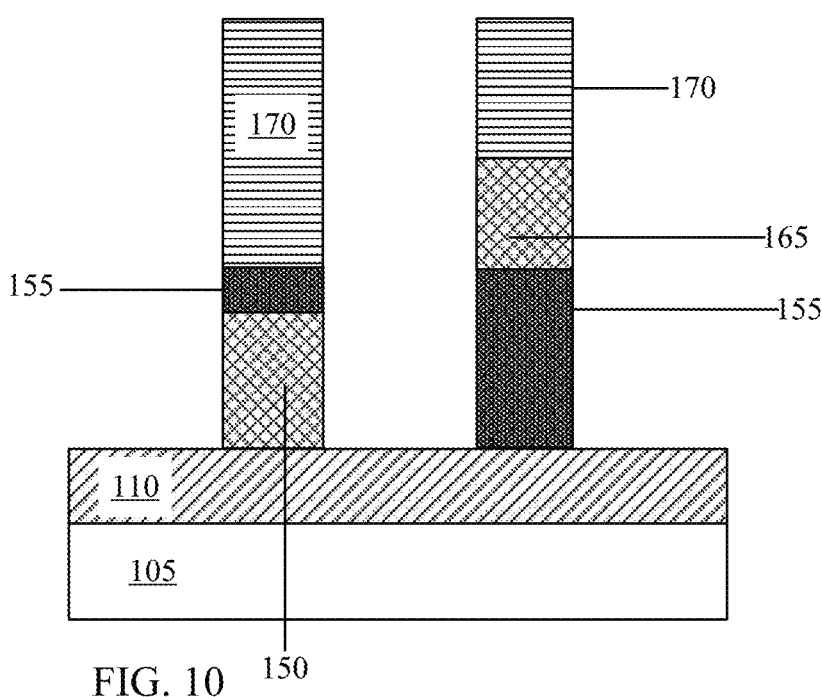
FIG. 10 illustrates a cross section $X_2$ of the gate cut region after the formation of the gate cut, in accordance with the embodiment of the present invention.
Figure 11:
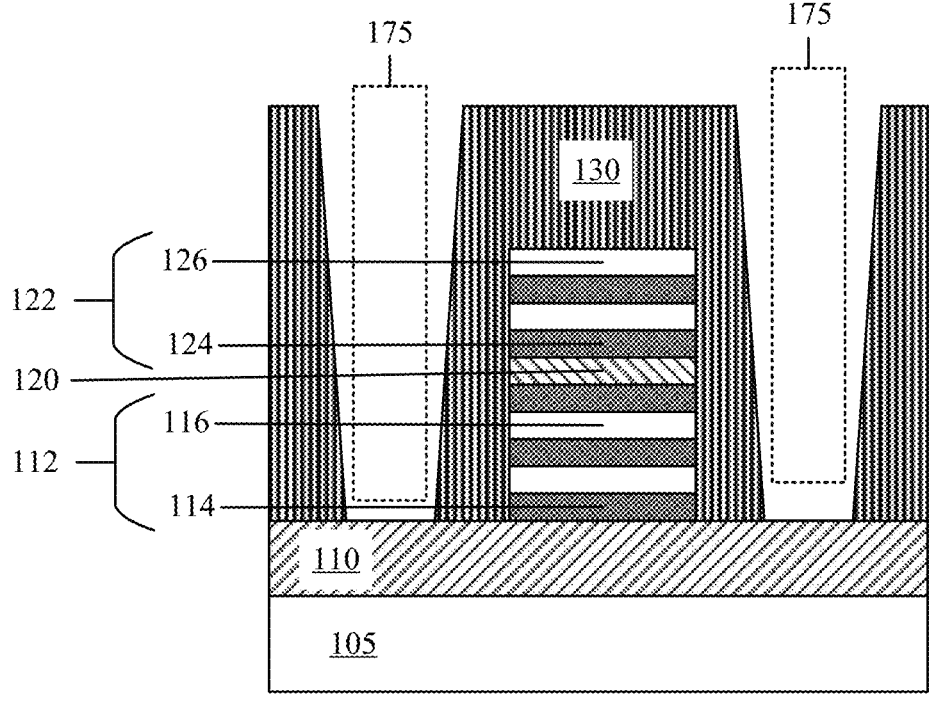
FIG. 11 illustrates a cross section $Y_1$ of the gate region after the formation of the gate cut, in accordance with the embodiment of the present invention.

FIGS. 9, 10 and 11 illustrates a process stage after gate patterning is performed by a conventional lithography and etching process, which selectively etching the dummy gate 130, upper spacer 140, selective to interlayer dielectric 170. FIG. 9 illustrates a cross section $X_1$ of the stacked device region after the formation of a gate cut, in accordance with the embodiment of the present invention. FIG. 10 illustrates a cross section $X_2$ of the gate cut region after the formation of the gate cut 175, in accordance with the embodiment of the present invention. A lithography layer (not show) is formed on top of the interlayer dielectric 170 and on top of the dummy gate 130. The underlying layers are patterned and the dummy gate 130 and the upper spacer 140 are removed. Columns comprised of the first placeholder 150, the middle isolation layer 155, the second placeholder 165, and the interlayer dielectric 170 remain.

FIG. 11 illustrates a cross section $Y_1$ of the gate region after the formation of the gate cut 175, in accordance with the embodiment of the present invention. A lithography layer (not shown) is formed on top of the dummy gate 130 and the dummy gate 130 is patterned. Gate cuts 175 are formed in the dummy gate 130.

Figure 12:
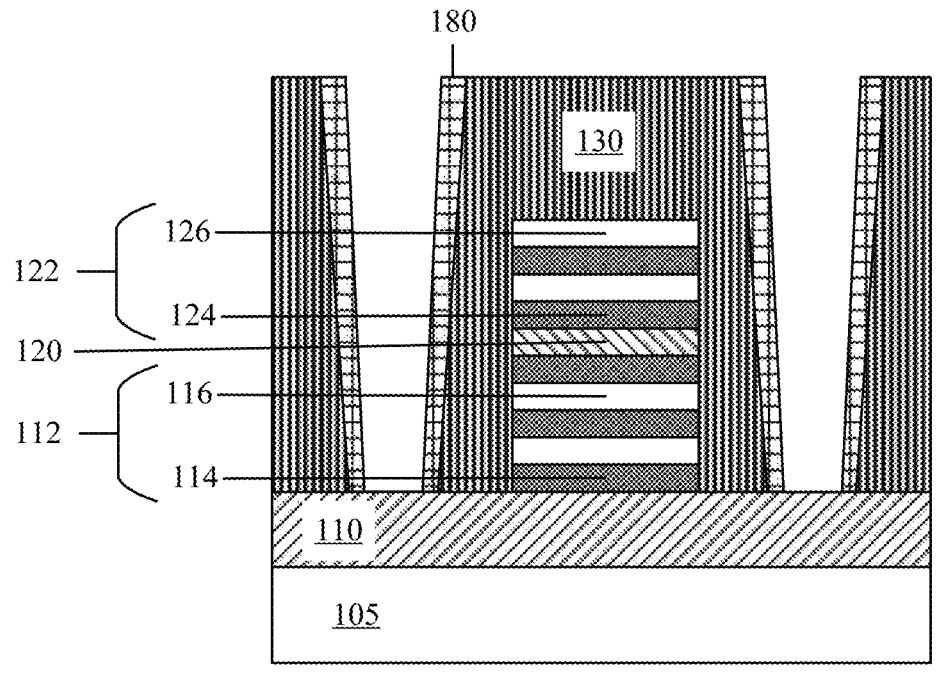
FIG. 12 illustrates a cross section $Y_1$ of the gate region after the formation of the gate cut liner, in accordance with the embodiment of the present invention.

FIG. 12 illustrates a process stage after formation of a selective dielectric liner 180 over the exposed surfaces of dummy gate, followed by an anisotropic etching process to remove any horizontal portions of dielectric liner 180. FIG. 12 illustrates a cross section $Y_1$ of the gate region after the formation of the selective dielectric liner 180, in accordance with the embodiment of the present invention. A selective dielectric liner 180 is formed on the exposed surfaces of dummy gate 130 and etched back so that the selective dielectric liner 180 remains on the sidewalls of the gate cut 175.

Figure 13:
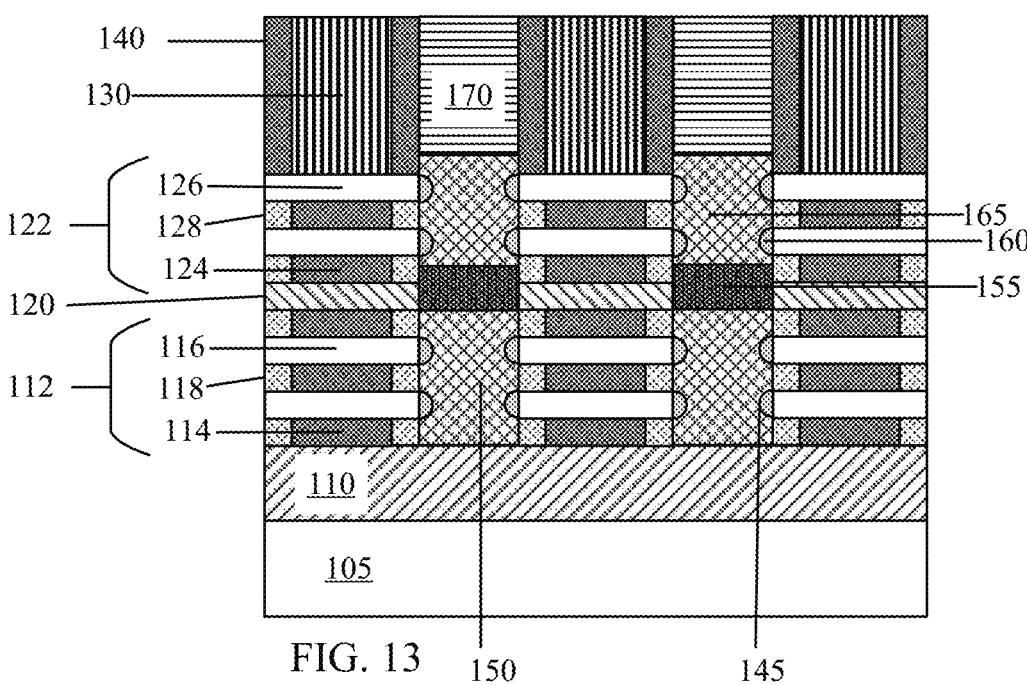
FIG. 13 illustrates a cross section $X_1$ of the stacked device region after the formation of a dielectric fill layer, in accordance with the embodiment of the present invention.
Figure 14:
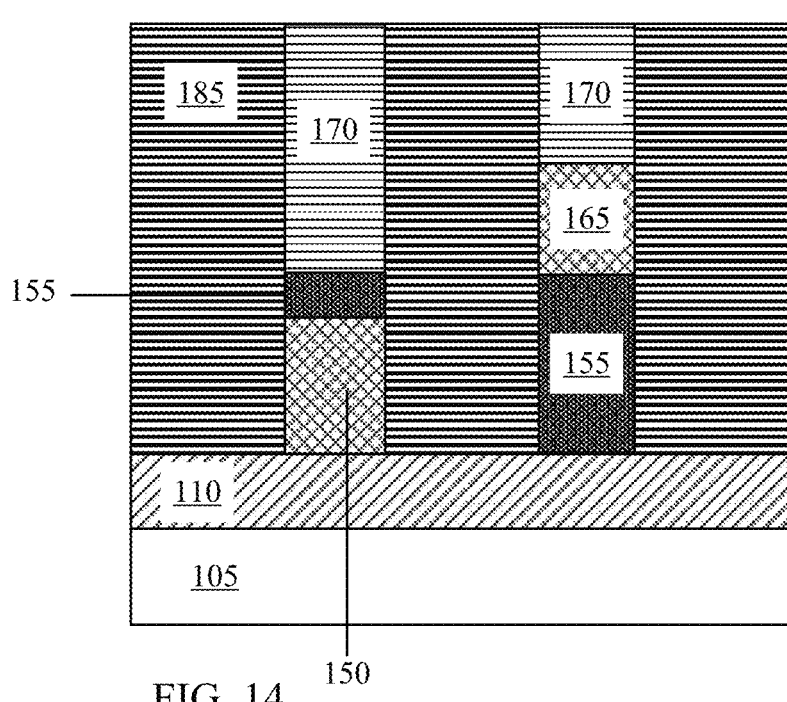
FIG. 14 illustrates a cross section $X_2$ of the gate cut region after the formation of a dielectric fill layer, in accordance with the embodiment of the present invention.
Figure 15:
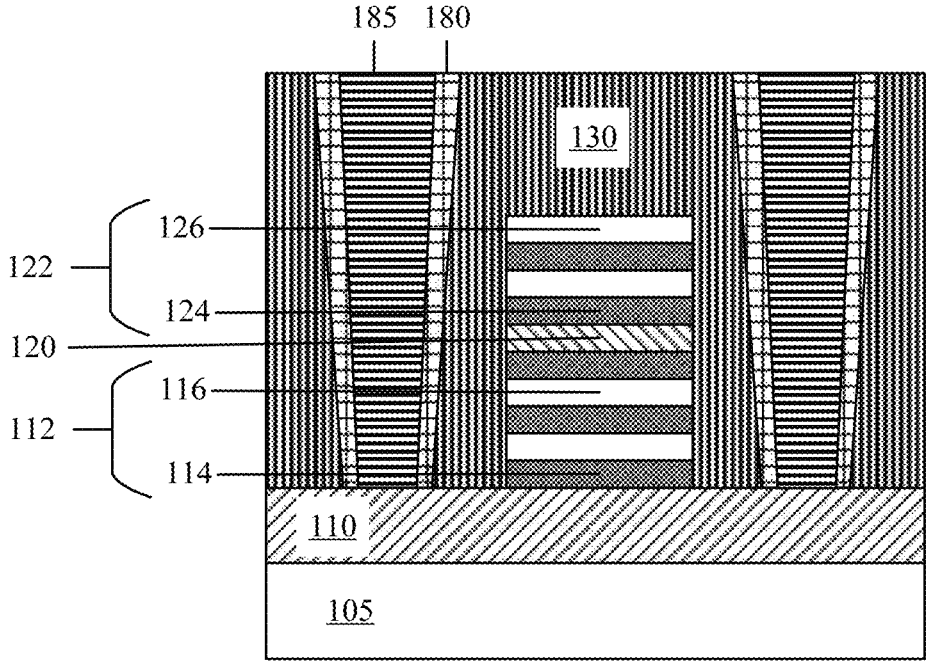
FIG. 15 illustrates a cross section $Y_1$ of the gate region after the formation of a dielectric fill layer, in accordance with the embodiment of the present invention.

FIGS. 13, 14 and 15 illustrate a process stage after the formation of a dielectric fill layer 185, in accordance with the embodiment of the present invention. FIG. 13 illustrates a cross section $X_1$ of the stacked device region after the formation of a dielectric fill layer 185, in accordance with the embodiment of the present invention. FIG. 14 illustrates a cross section $X_2$ of the gate cut region after the formation of a dielectric fill layer 185, in accordance with the embodiment of the present invention. FIG. 15 illustrates a cross section $Y_1$ of the gate region after the formation of a dielectric fill layer 185, in accordance with the embodiment of the present invention. A dielectric fill layer 185 is formed on the buried oxide layer 110 and extends up the sidewalls of the columns that contains the first placeholder 150, the middle isolation layer 155, the second placeholder 165, and the interlayer dielectric 170. The dielectric fill layer 185 further fills the gate cut 175 and the dielectric fill layer 185 is in contact with selective dielectric liner 180.

Figure 16:
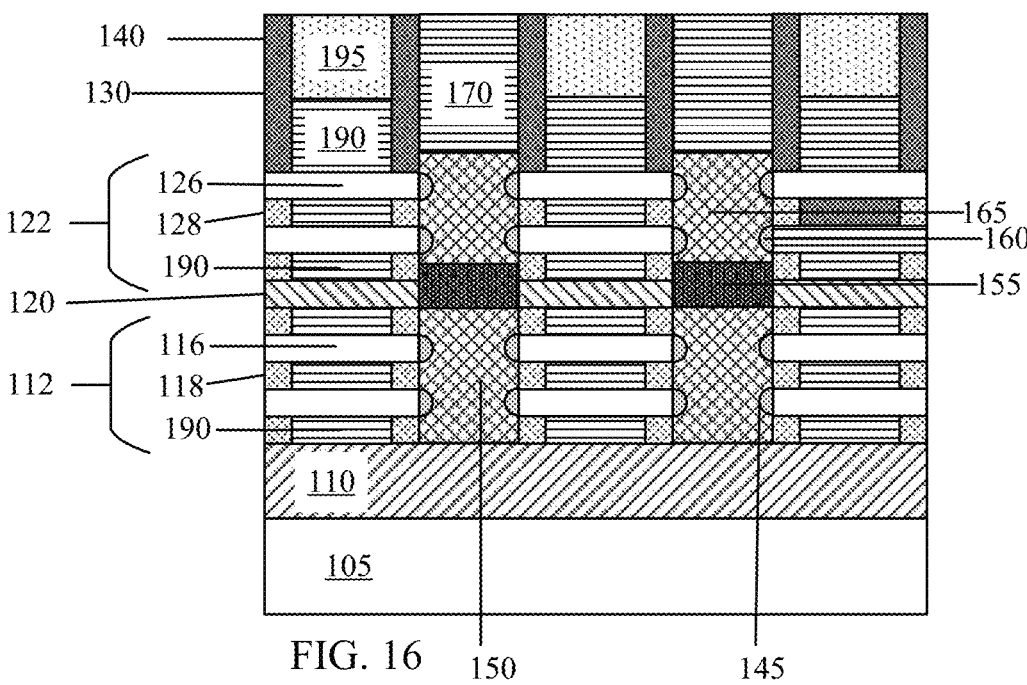
FIG. 16 illustrates a cross section $X_1$ of the stacked device region after the formation of the gate, in accordance with the embodiment of the present invention.
Figure 17:
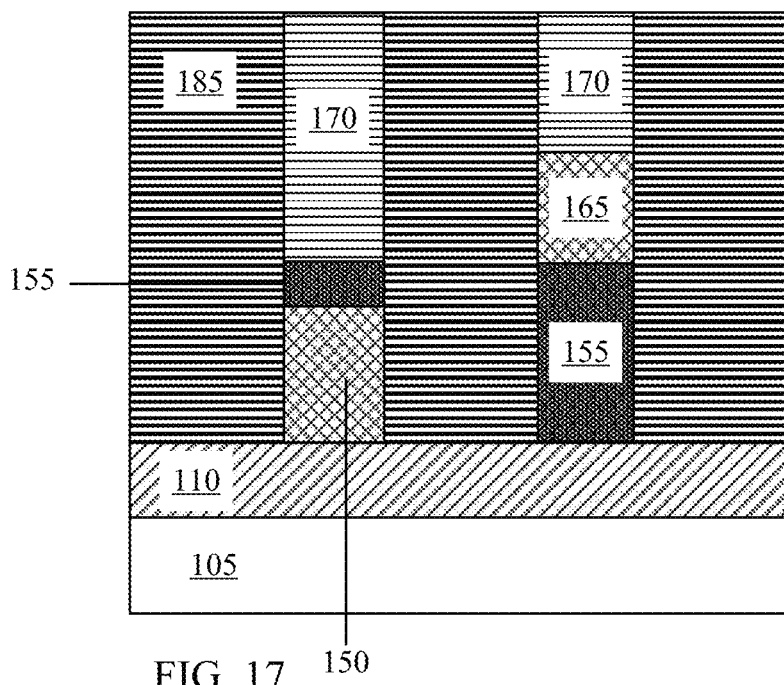
FIG. 17 illustrates a cross section $X_2$ of the gate cut region after the formation of a gate, in accordance with the embodiment of the present invention.
Figure 18:
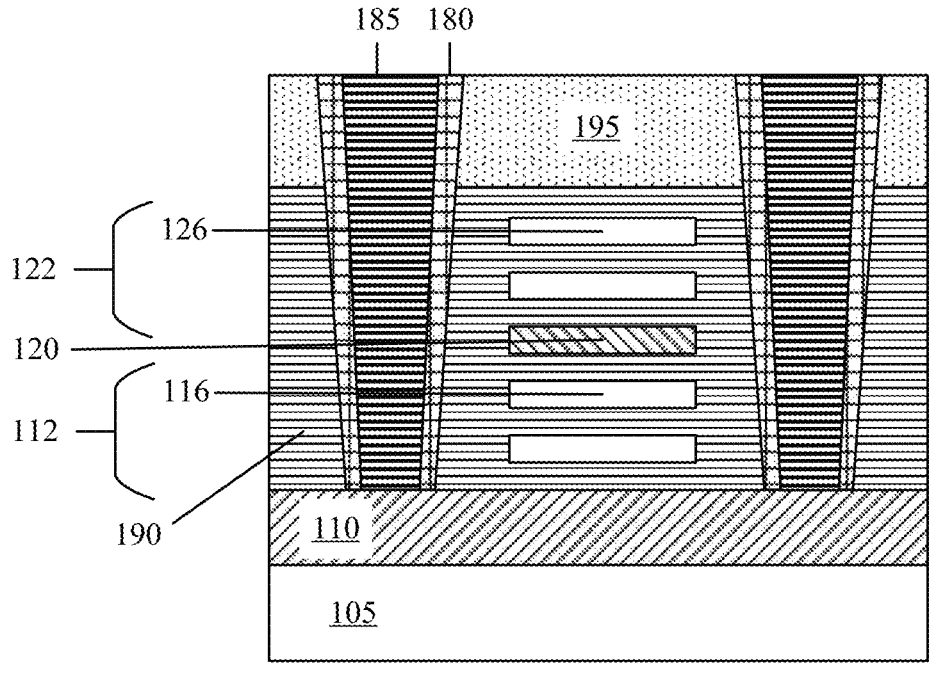
FIG. 18 illustrates a cross section $Y_1$ of the gate region after the formation of a gate, in accordance with the embodiment of the present invention.

FIGS. 16, 17 and 18 illustrate a process stage after dummy gate 130 and sacrificial SiGe (bottom sacrificial layer 114, and upper sacrificial layer 124) is removed, followed by gate 190, and gate cap 195 formation. FIG. 16 illustrates a cross section $X_1$ of the stacked device region after the formation of the gate 190, in accordance with the embodiment of the present invention. FIG. 17 illustrates a cross section $X_2$ of the gate cut region after the formation of a gate 190, in accordance with the embodiment of the present invention. FIG. 18 illustrates a cross section $Y_1$ of the gate region after the formation of a gate 190, in accordance with the embodiment of the present invention. The bottom sacrificial layers 114, the upper sacrificial layers 124, and the dummy gate 130 are removed creating an empty space. The gate 190 is formed by filling empty space with the gate material. The gate 190 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A gate cap 195 is formed on top of the gate 190 after gate CMP and gate recess.

Figure 19:
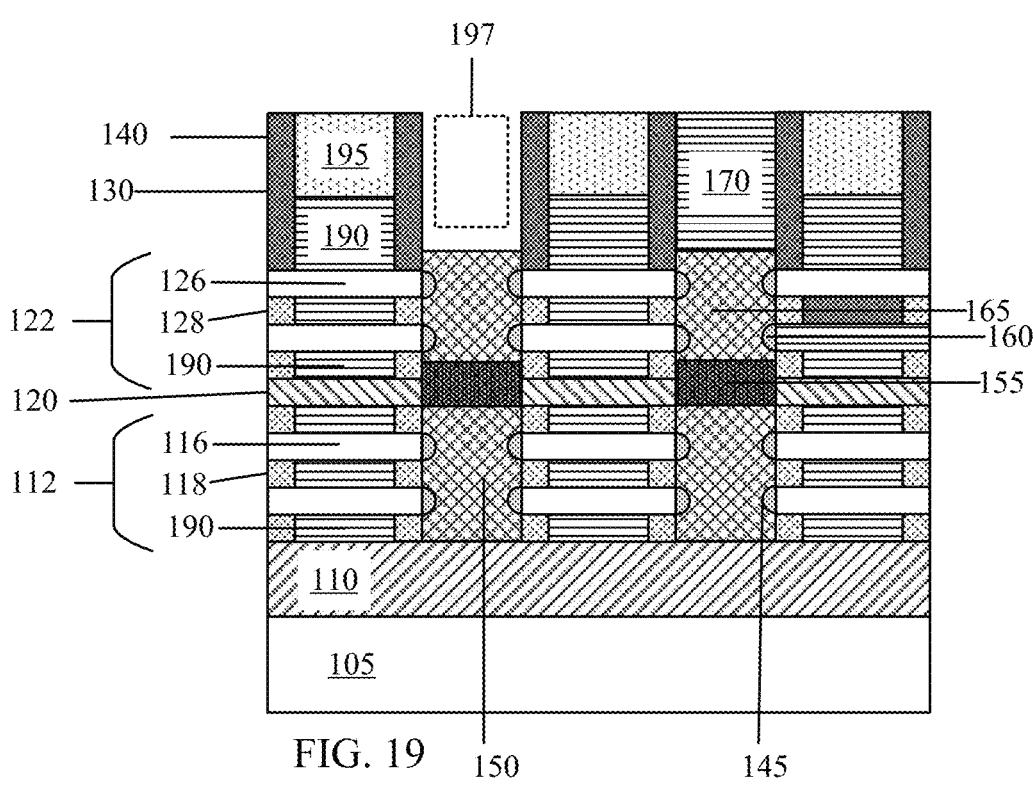
FIG. 19 illustrates a cross section $X_1$ of the stacked device region after the formation of a contact cut, in accordance with the embodiment of the present invention.
Figure 20:
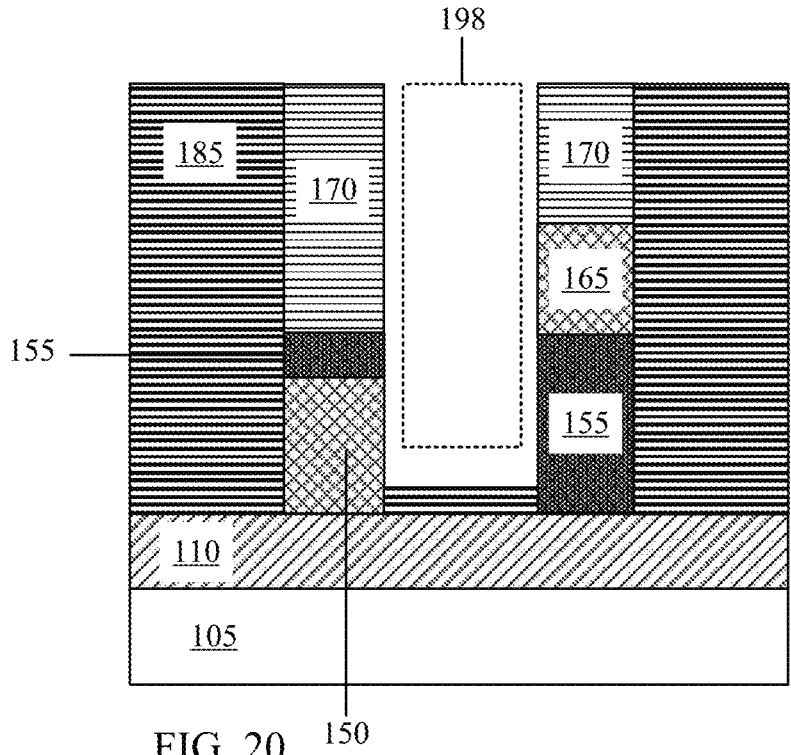
FIG. 20 illustrates a cross section $X_2$ of the gate cut region after the formation of a first interconnect cut, in accordance with the embodiment of the present invention.
Figure 21:
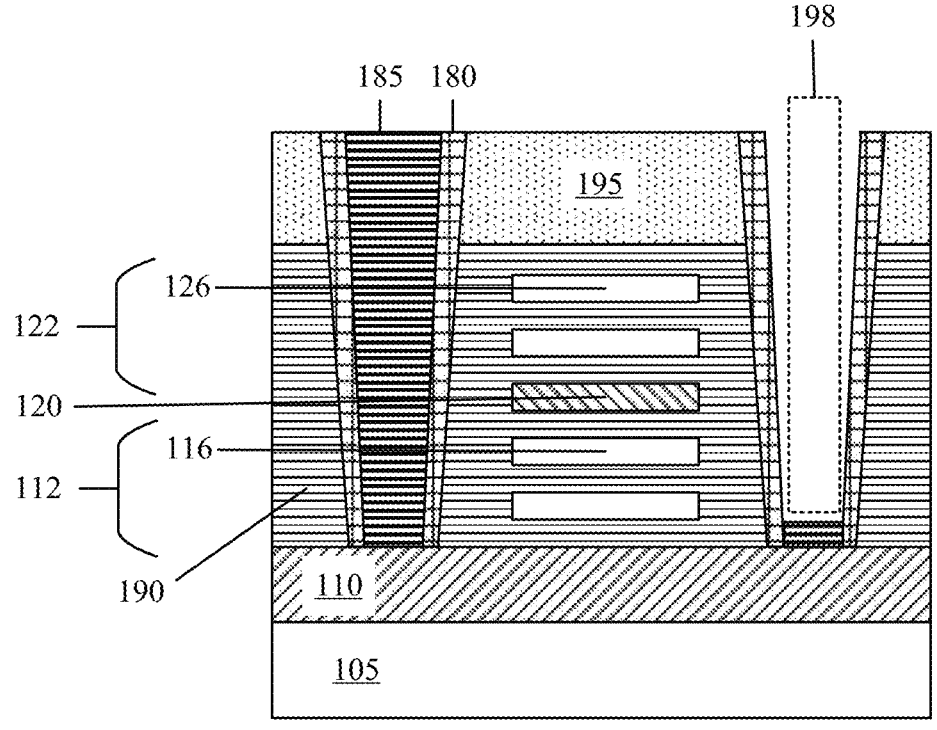
FIG. 21 illustrates a cross section $Y_1$ of the gate region after the formation of a first interconnect cut, in accordance with the embodiment of the present invention.

FIGS. 19, 20 and 21 illustrate a process stage after formation of source/drain contact openings and local interconnect contact openings, by litho and etching process. FIG. 19 illustrates a cross section $X_1$ of the stacked device region after the formation of a contact opening 197, in accordance with the embodiment of the present invention. A portion of the interlayer dielectric 170 is removed to form a contact opening 197. FIG. 20 illustrates a cross section $X_2$ of the gate cut region after the formation of a first interconnect opening 198, in accordance with the embodiment of the present invention. The first interconnect opening 198 is formed by removing a portion of the dielectric fill layer 185 located between the columns comprised of the first placeholder 150, the middle isolation layer 155, the second placeholder 165, and the interlayer dielectric 170. FIG. 21 illustrates a cross section $Y_1$ of the gate region after the formation of a first interconnect opening 198, in accordance with the embodiment of the present invention. The dielectric fill layer 185 located within a portion of the gate cut 175 is removed to create the interconnect opening 198. The etch process of the dielectric fill layer 185 can be selective to the selective dielectric liner 180, such that local interconnect 212 is isolated from the gate 190.

Figure 22:
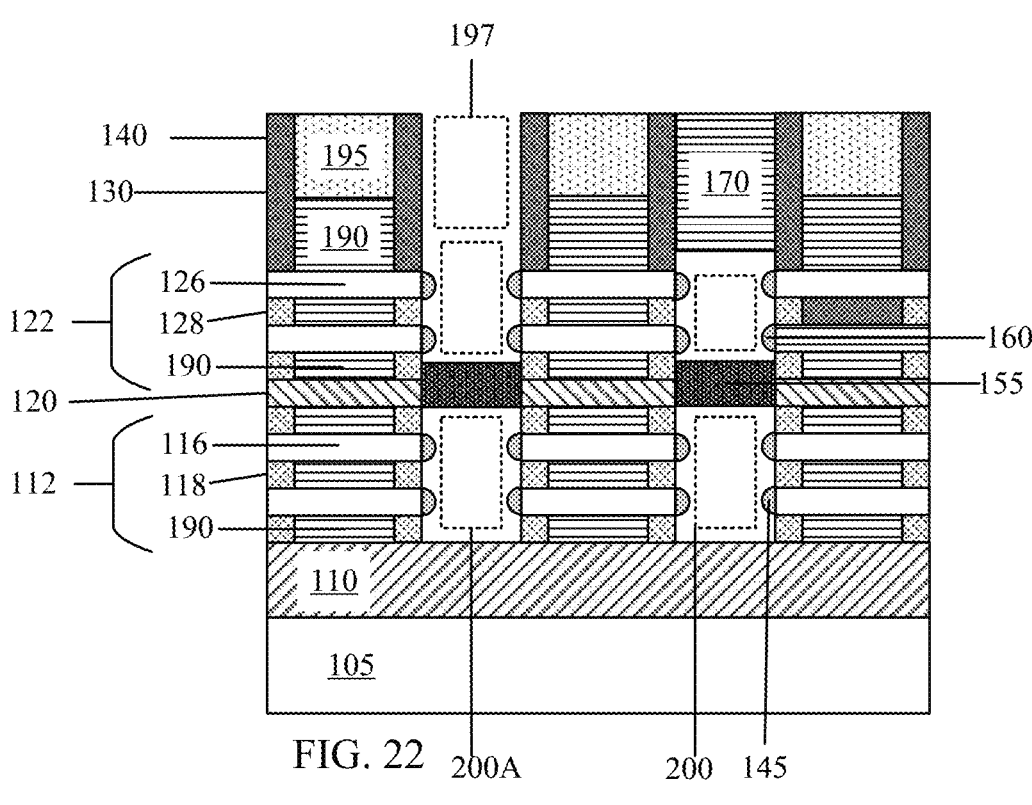
FIG. 22 illustrates a cross section $X_1$ of the stacked device region after the removal of the first placeholder and the second placeholder, in accordance with the embodiment of the present invention.
Figure 23:
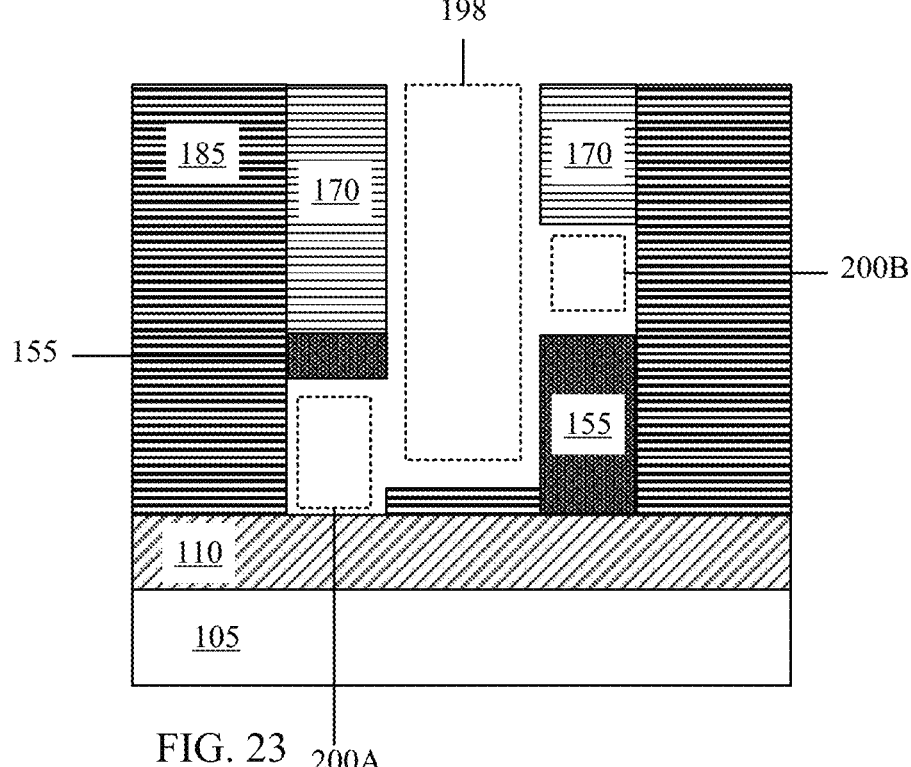
FIG. 23 illustrates a cross section $X_2$ of the gate cut region after the removal of the first placeholder and the second placeholder, in accordance with the embodiment of the present invention.
Figure 24:
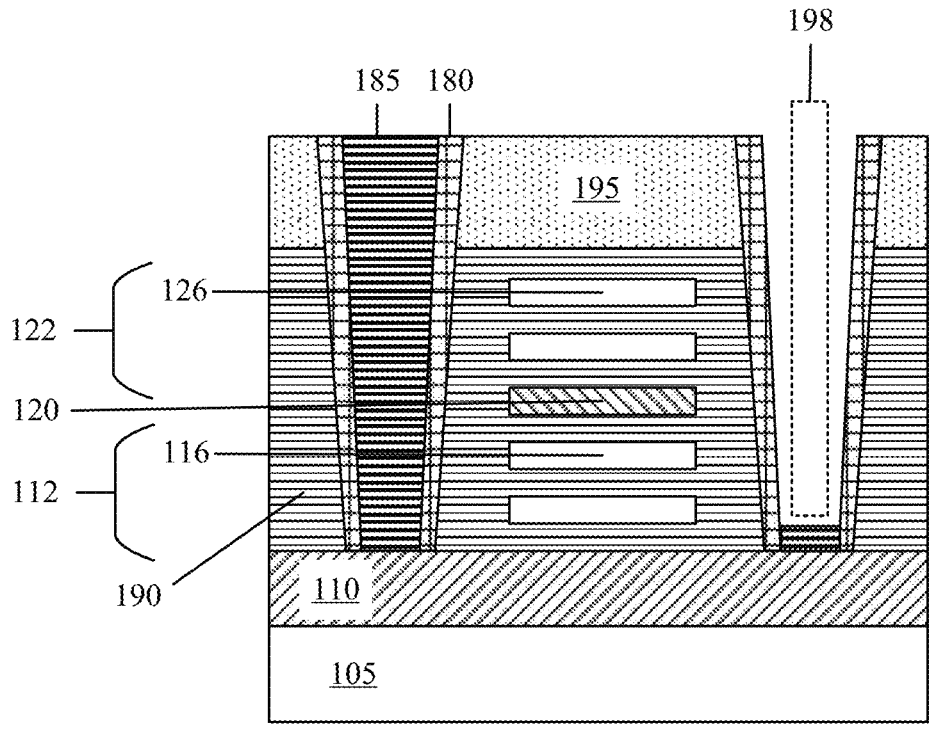
FIG. 24 illustrates a cross section $Y_1$ of the gate region after the removal of the first placeholder and the second placeholder, in accordance with the embodiment of the present invention.

FIGS. 22, 23, and 24 illustrate a process stage after the removal of the first placeholder 150 and the second placeholder 165, in accordance with the embodiment of the present invention. FIG. 22 illustrates a cross section $X_1$ of the stacked device region after the removal of the first placeholder 150 and the second placeholder 165, in accordance with the embodiment of the present invention. FIG. 23 illustrates a cross section $X_2$ of the gate cut region after the removal of the first placeholder 150 and the second placeholder 165, in accordance with the embodiment of the present invention. FIG. 24 illustrates a cross section $Y_1$ of the gate region after the removal of the first placeholder 150 and the second placeholder 166, in accordance with the embodiment of the present invention. The first placeholder 150 and the second placeholder 165 are selectively removed to create contact opening 200 and a second interconnected opening 200A. As illustrated by FIG. 23, the second interconnect opening 200A is connected to the interconnect opening 198, thus forming a connection with the bottom source/drain 145 and the interconnect opening 198. A third interconnect opening 200B is also connected to the interconnect opening 198. The third interconnect opening 200B will be connected to an upper source/drain 160 (not show) of a different cell. As seen by FIG. 22, the contact opening 197 is connected to one of the second interconnect opening 200. The layout where the first placeholder 150 and the second placeholder 165 are located will determine where the second interconnect opening 200A, or third interconnect opening 200B, etc., will be located. These locations will determine to which source/drain 145, 160 the interconnect will be connected to.

Figure 25:
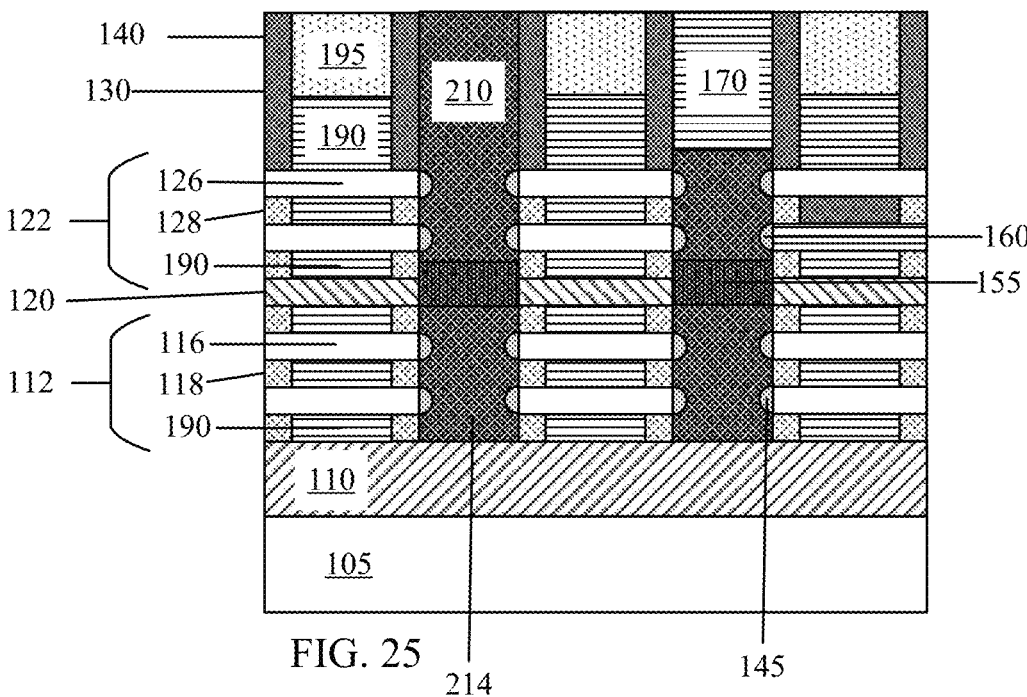
FIG. 25 illustrates a cross section $X_1$ of the stacked device region after the formation of the interconnect, in accordance with the embodiment of the present invention.
Figure 26:
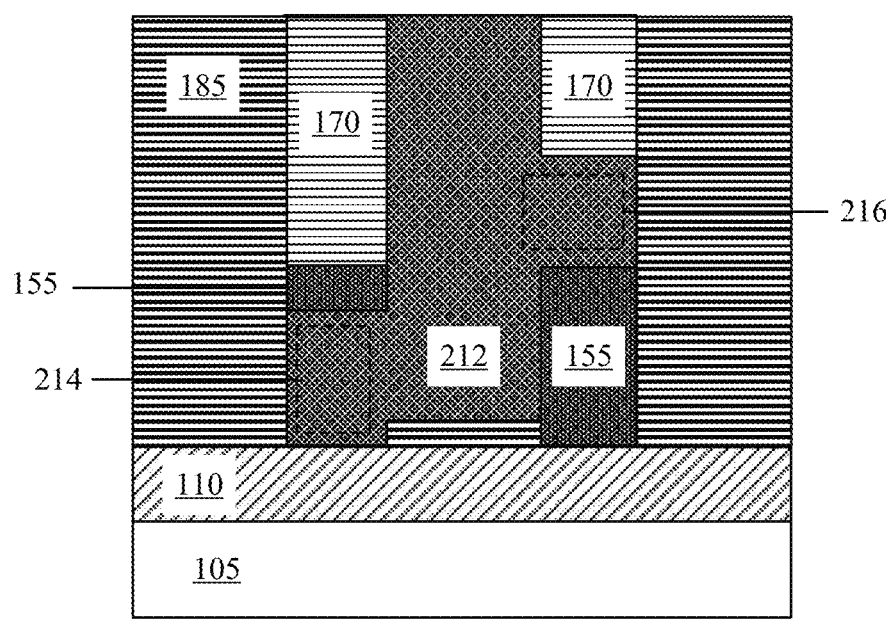
FIG. 26 illustrates a cross section $X_2$ of the gate cut region after the formation of the interconnect, in accordance with the embodiment of the present invention.
Figure 27:
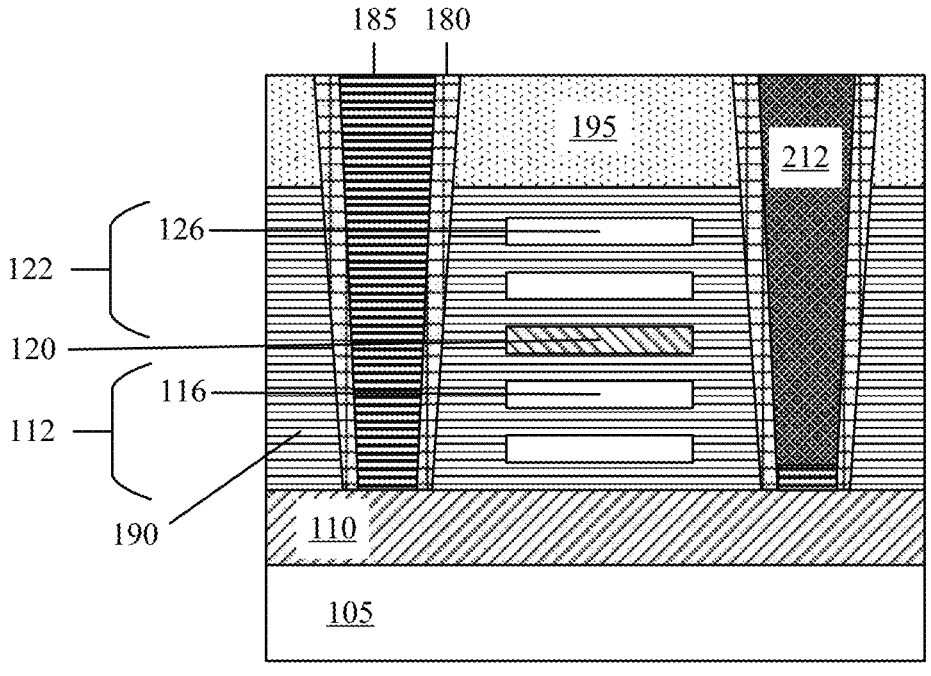
FIG. 27 illustrates a cross section $Y_1$ of the gate region after the formation of the interconnect, in accordance with the embodiment of the present invention.

FIGS. 25, 26 and 27 illustrate a process stage after metallization of contacts and local interconnects. FIG. 25 illustrates a cross section $X_1$ of the stacked device region after the formation of the contact 210, in accordance with the embodiment of the present invention. The contact opening 197 and the second interconnect opening 200A are filled in with a conductive metal to form the contact 210 and the interconnect arm 214.

FIG. 26 illustrates a cross section $X_2$ of the gate cut region after the formation of the interconnect 212, in accordance with the embodiment of the present invention. FIG. 27 illustrates a cross section $Y_1$ of the gate region after the formation of the interconnect 212, in accordance with the embodiment of the present invention. The interconnect 212 is located within the dielectric fill layer 185. The interconnect 212 has a center section located within the dielectric fill layer 185 and has an interconnect arm 214 to connect to a bottom source/drain 145. The interconnect 212 has a second interconnect arm 216 connected to an upper source/drain 160. The example interconnect illustrated by FIG. 26, has an interconnect arm 214 which connects to a bottom source/drain 145 of a first cell and has a second interconnect arm 216 that connects to an upper source/drain 160 of a second cell.

Figure 28:
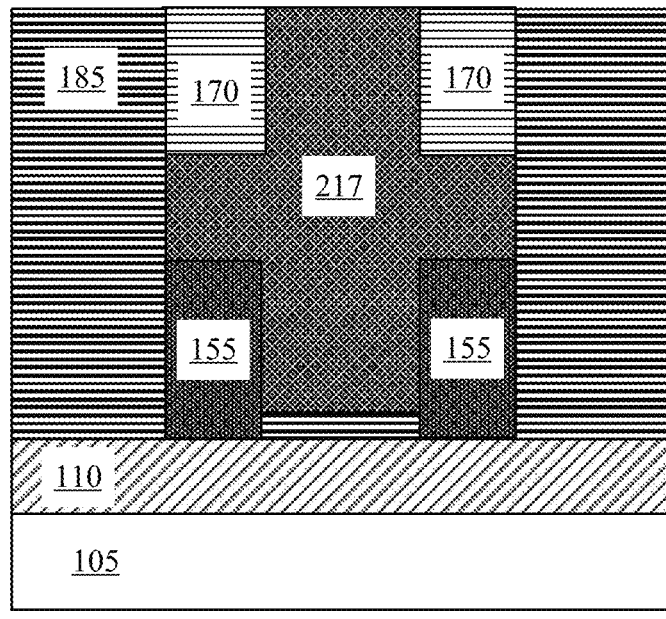
FIGS. 28 to 35 illustrates a cross section $X_2$ of the gate cut region after the formation of the plurality of different interconnect configurations, in accordance with the embodiment of the present invention.
Figure 29:
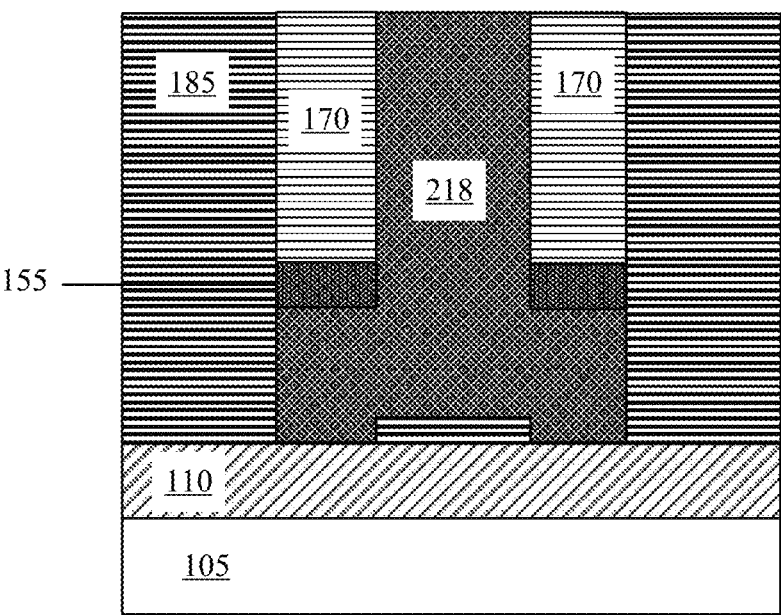
Figure 30:
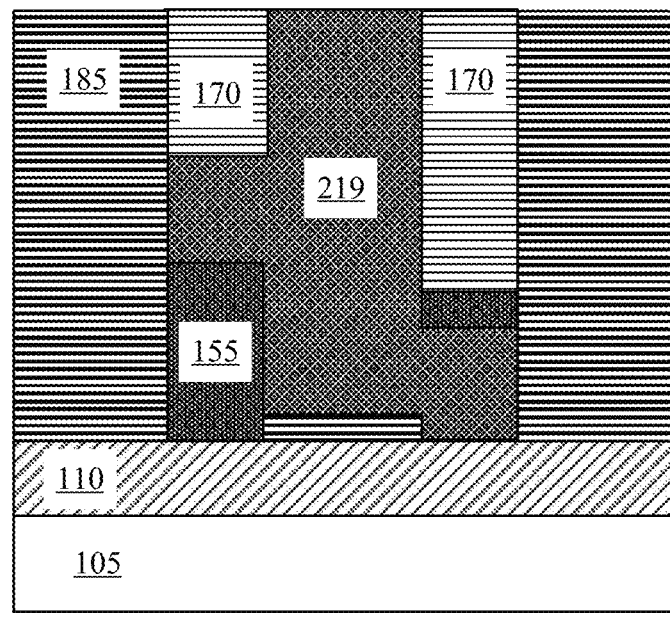
Figure 31:
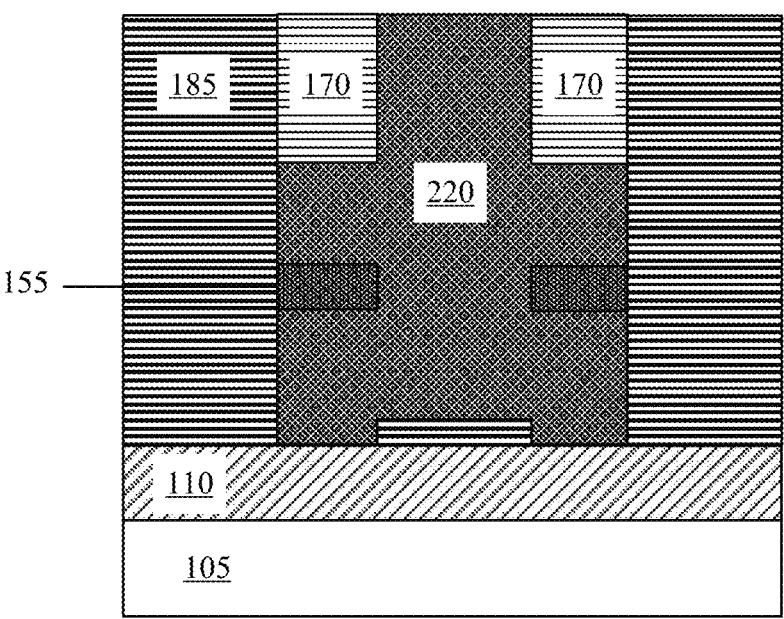
Figure 32:
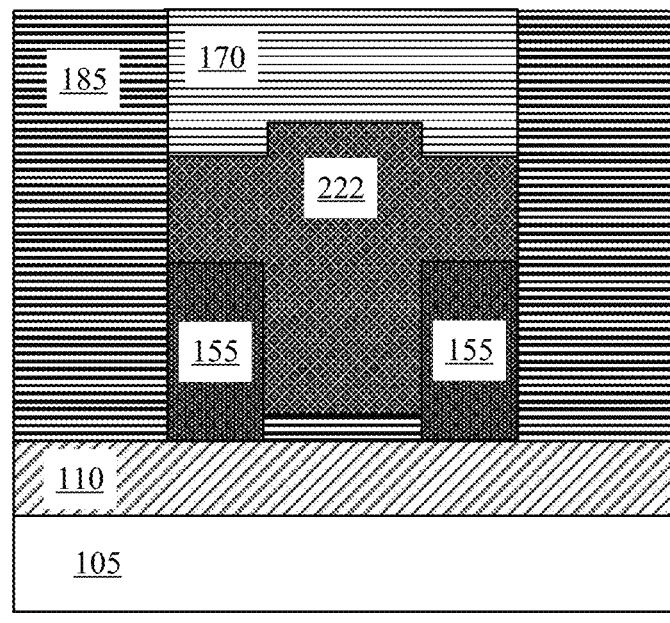
Figure 33:
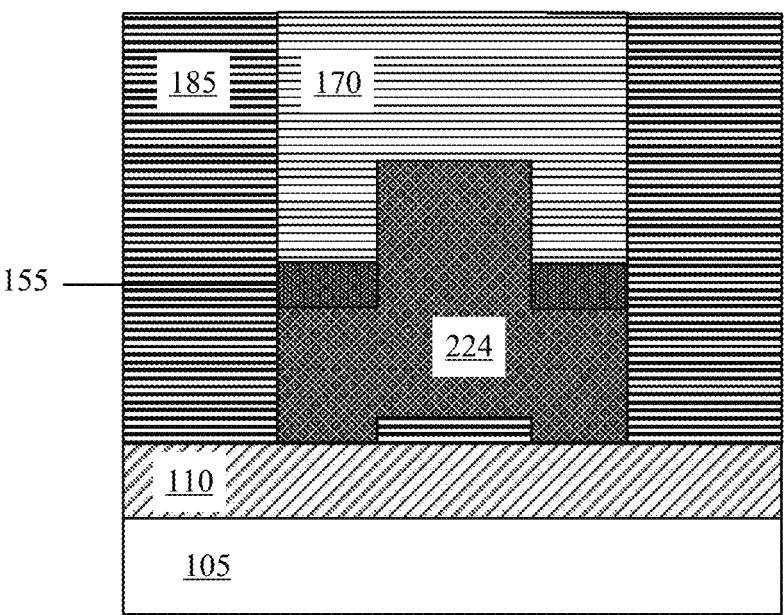
Figure 34:
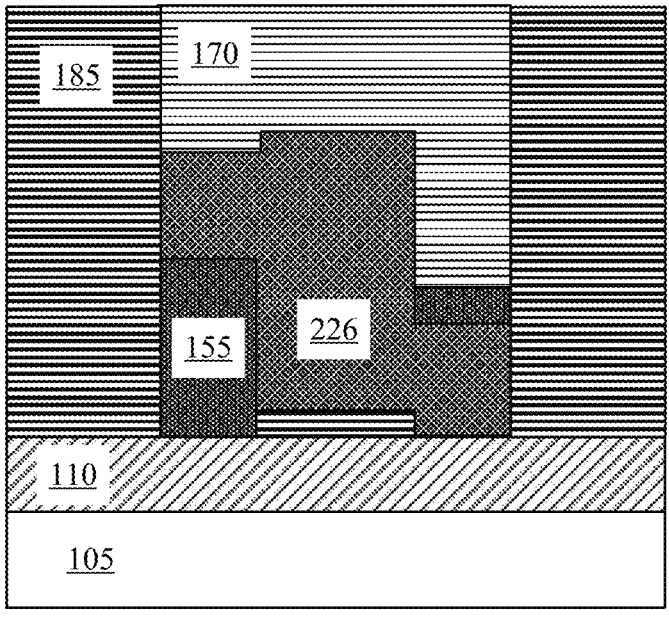
Figure 35:
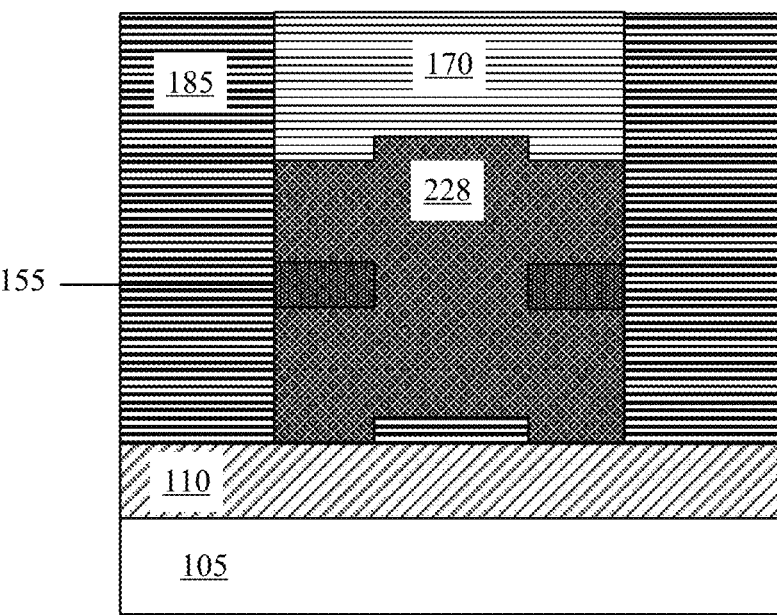

FIGS. 28 to 35 illustrates a cross section $X_2$ of the gate cut region after the formation of the plurality of different interconnect configurations, in accordance with the embodiment of the present invention. FIGS. 28 and 32 illustrate different configurations for the interconnect 217, 222 to form a connection between two upper source/drains 160 in two different cells. FIGS. 29 and 33 illustrate different configurations for the interconnect 218, 224 to form a connection between two bottom source/drains 145 in two different cells. FIGS. 30 and 34 illustrate different configurations for the interconnect 219, 226 to form a connection between an upper source/drain 160 and a bottom source/drain 145 in two different cells. The configuration represented in FIGS. 30 and 34 is a mirror of the configuration represented in FIG. 26. FIGS. 31 and 35 illustrate different configurations for the interconnect 220, 228 to form a connection between two upper source/drains 160 and two bottom source/drains 145 in at least two different cells.

Figure 36:
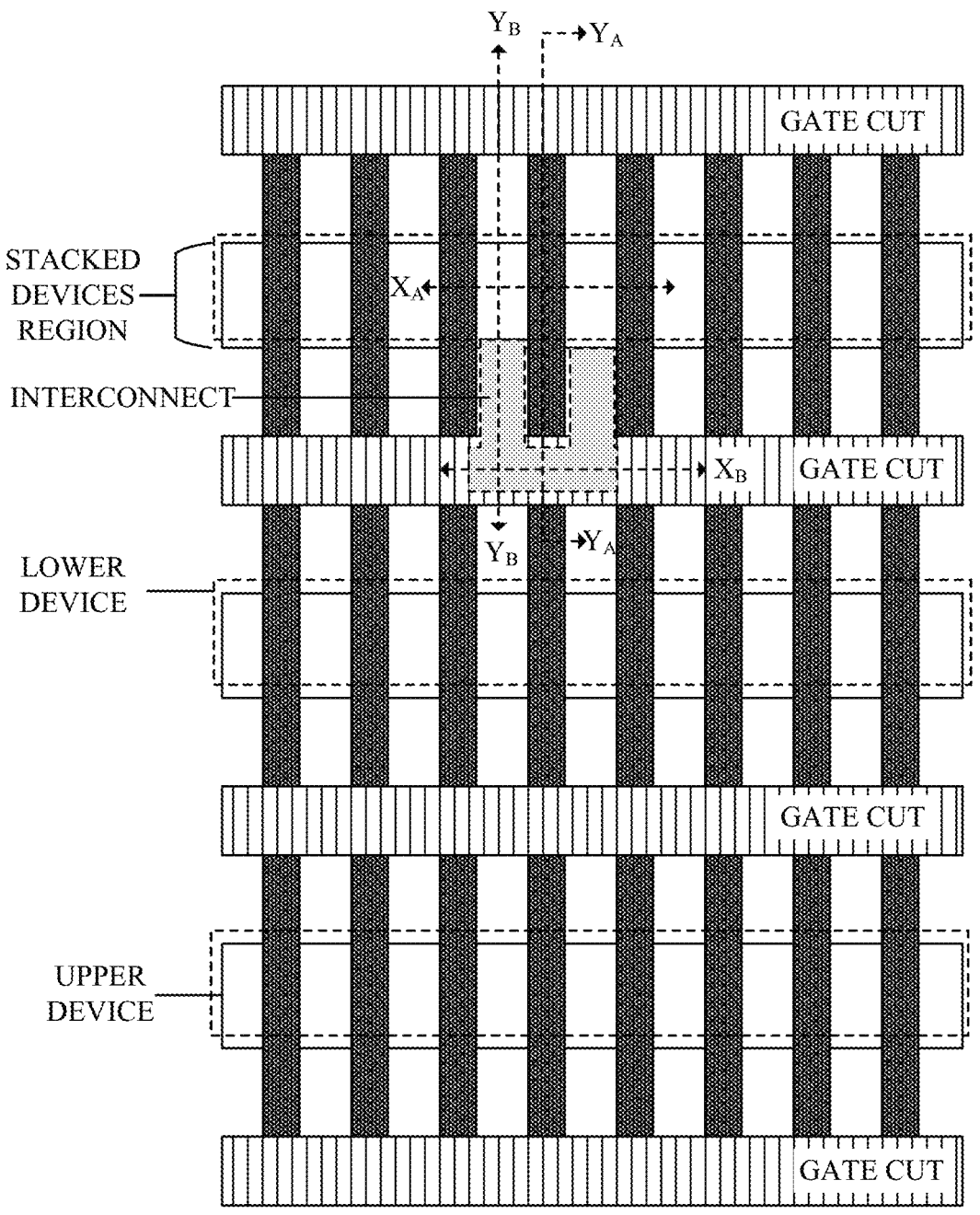
FIG. 36 illustrates a top-down view of stack devices separated by a gate cut, in accordance with the embodiment of the present invention.

FIG. 36 illustrates a top-down view of stack devices separated by a gate cut, in accordance with the embodiment of the present invention. The present invention is comprised one or more stacked devices, having a lower device and an upper device. The stacked devices are flipped over to allow for the backside processing of the devices. The stacked devices are separated from adjacent stack devices by a gate cut filled with a dielectric material. FIG. 36 illustrates only a single interconnect, but the stacked devices can have one or more of the interconnects can be present in the stacked devices. Cross section $X_A$ extends through horizontal of the stacked devices region. Cross section $X_B$ extends through the horizontal of the gate cut. Cross section $Y_A$ is perpendicular to cross section $X_A$ and cross section $X_B$, where cross section $Y_A$ is through the gate region of the stacked devices. Cross section $Y_B$ is perpendicular to cross section $X_A$ and cross section $X_B$, where cross section $Y_B$ is through the source/drain region of the stacked devices.

Figures 37, 38:
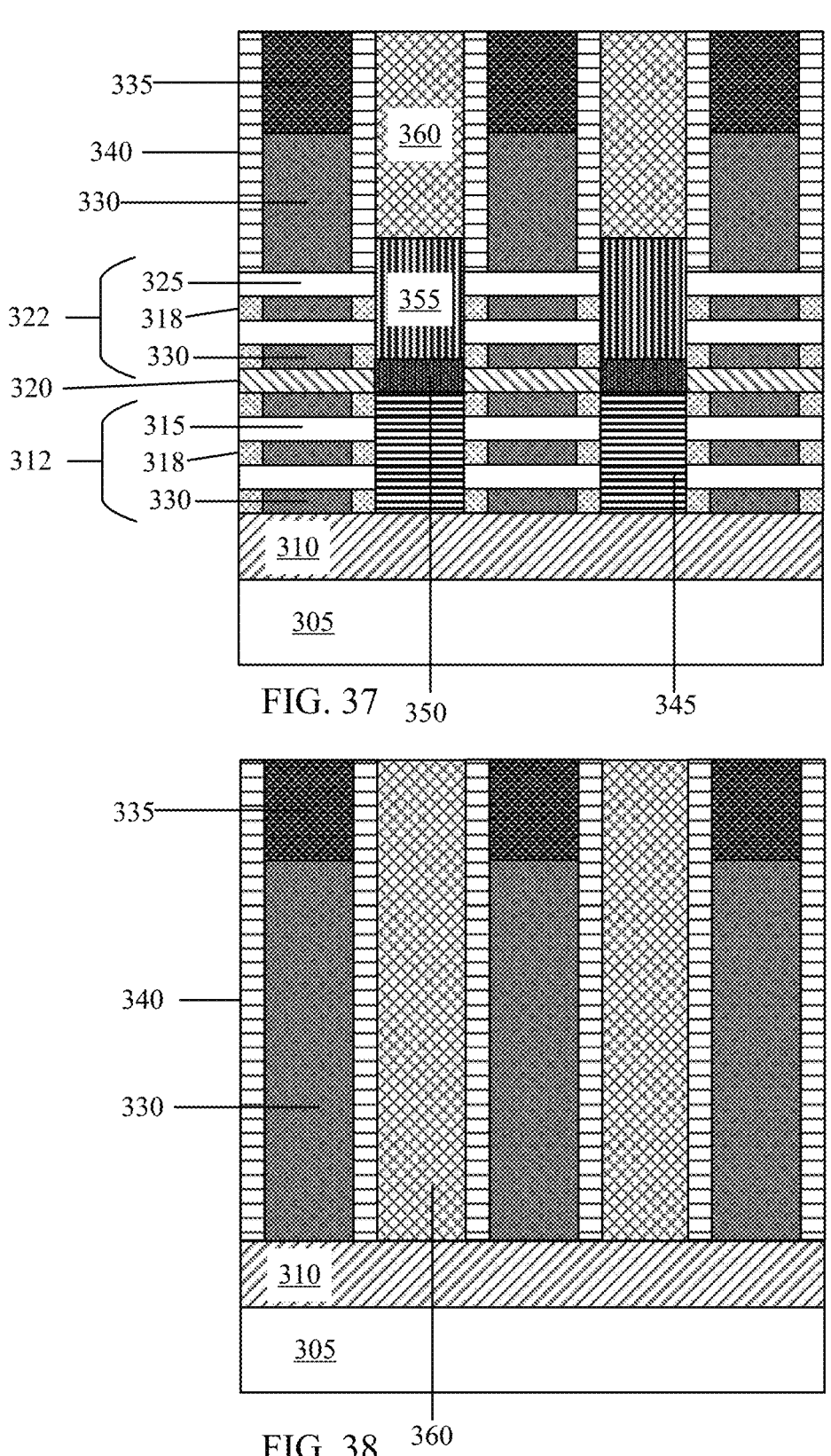
FIG. 37 illustrates a cross section $X_A$ of the stacked device region after the formation of bottom and upper source/drain and the gate, in accordance with the embodiment of the present invention.
FIG. 38 illustrates a cross section $X_B$ of the gate cut region after the formation of bottom and upper source/drain and a gate, in accordance with the embodiment of the present invention.

FIGS. 37, 38, 39 and 40 illustrate the process stage after bottom and upper source/drain regions are formed. FIG. 37 illustrates a cross section $X_A$ of the stacked device region after the formation of bottom and upper source/drain 345, 355 and the gate 330, in accordance with the embodiment of the present invention. The stacked devices include a substrate 305, an oxide layer 310, a bottom device 312, an isolation layer 320, an upper device 322, a gate 330, a gate cap 335, an upper spacer 340, inner spacers 318, a bottom source/drain 345, a middle isolation layer 350, an upper source/drain 355, and an interlayer dielectric 360.

The substrate 305 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 305. In some embodiments, the substrate 305 includes both semiconductor materials and dielectric materials. The semiconductor substrate 305 may also comprise an organic semiconductor or a layered semiconductor such as, for example, Si/SiGe, a silicon-on-insulator or a SiGe-on-insulator. A portion or the entire semiconductor substrate 305 may also be comprised of an amorphous, polycrystalline, or monocrystalline. The semiconductor substrate 305 may be doped, undoped or contain doped regions and undoped regions therein.

The bottom device 312 includes a plurality of nanosheets 315, an inner spacer 318, and the gate 330. The upper device 322 includes a plurality of nanosheets 325, the inner spacer 318, and the gate 330. The gate 330 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The gate cap 335 is located on top of the gate 330.

The upper source/drain 355 and the bottom source/drain 350 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. The interlayer dielectric 360 is located on top of the upper source/drain 355.

FIG. 38 illustrates a cross section $X_B$ of the gate cut region after the formation of bottom and upper source/drain 345, 355 and the gate 330, in accordance with the embodiment of the present invention. FIG. 38 illustrates a plurality of columns that includes the gate 330, the gate cap 335, and the upper spacer 340. The interlayer dielectric 360 is located between the columns.

Figure 39:
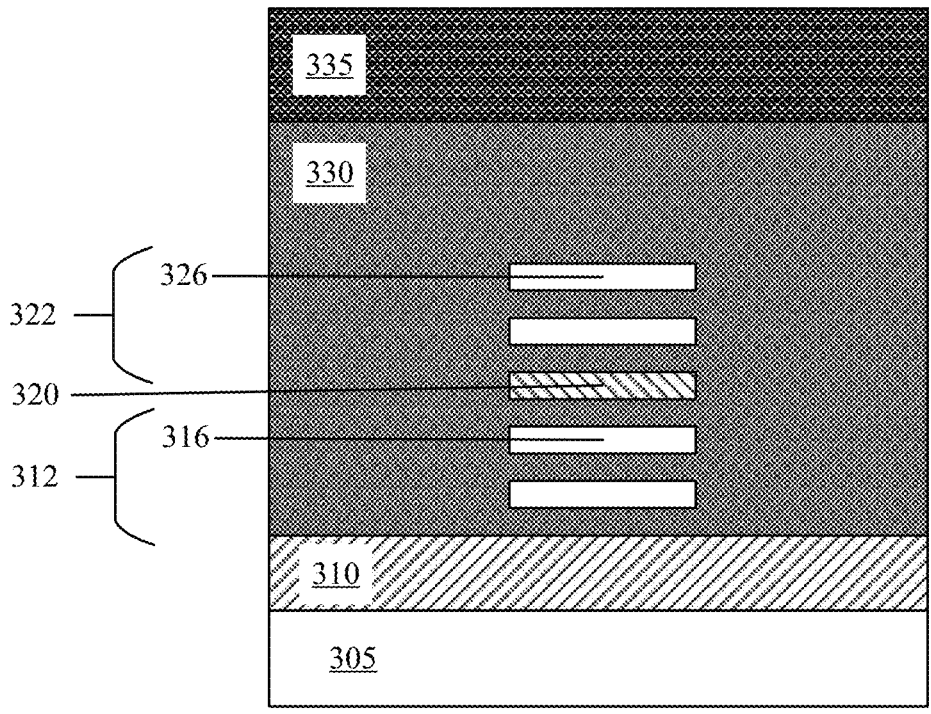
FIG. 39 illustrates a cross section $Y_A$ of the gate region after the formation of bottom and upper source/drain and a gate, in accordance with the embodiment of the present invention.

FIG. 39 illustrates a cross section $Y_A$ of the gate region after the formation of bottom and upper source/drain 345, 355 and the gate 330, in accordance with the embodiment of the present invention. The gate 330 is located all around the plurality of nanosheets 316, 326, and all around the isolation layer 320.

Figure 40:
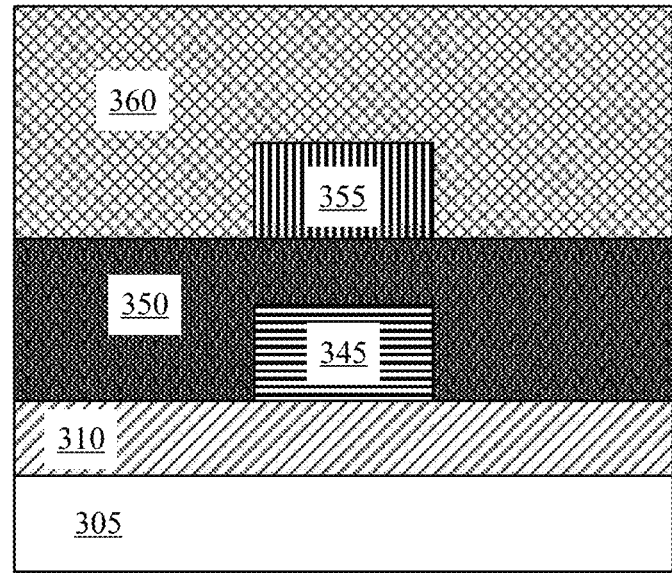
FIG. 40 illustrates a cross section $Y_B$ of the source/drain region after the formation of bottom and upper source/drain and a gate, in accordance with the embodiment of the present invention.

FIG. 40 illustrates a cross section $Y_B$ of the source/drain region after the formation of bottom and upper source/drain 345, 355 and the gate 330, in accordance with the embodiment of the present invention. The bottom source/drain 345 is located on top of the oxide layer 310. The middle isolation layer 350 is located atop of the oxide layer 310 and atop of the bottom source/drain 345. The middle isolation layer 355 is located on three sides of the bottom source/drain 345. The upper source/drain 355 is located on top of the middle isolation layer 350. The interlayer dielectric 360 is located on top of the middle isolation layer 350 and on top of the upper source/drain 355. The interlayer dielectric 360 is located on three sides of the upper source/drain 355.

Figure 41:
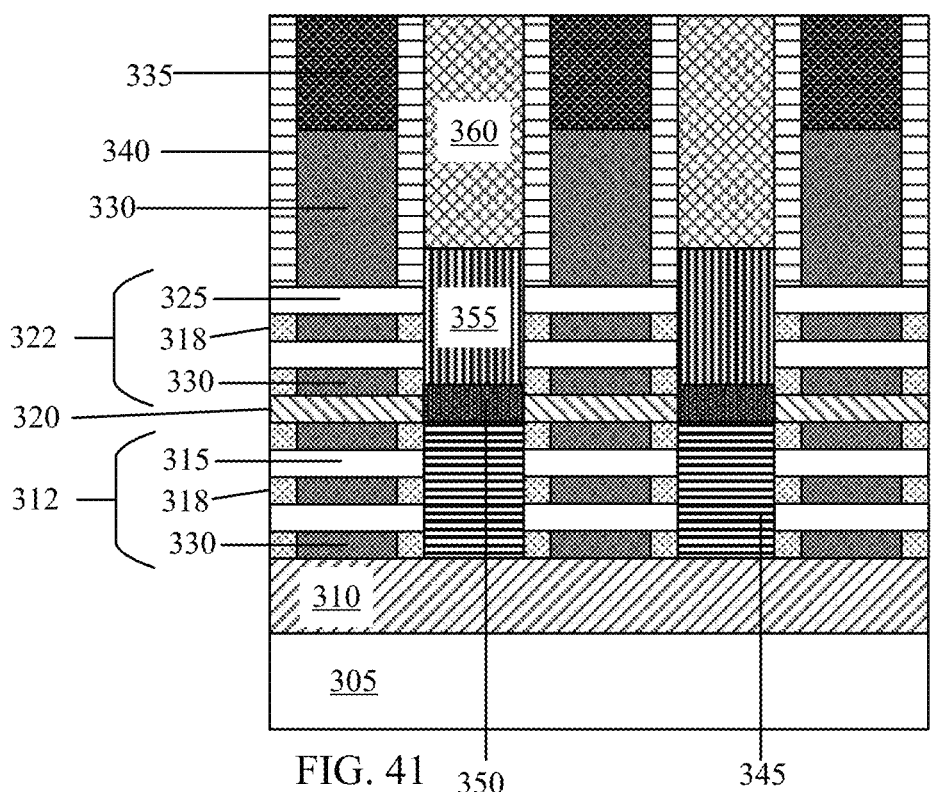
FIG. 41 illustrates a cross section $X_A$ of the stacked device region after the formation of the gate cut, in accordance with the embodiment of the present invention.
Figure 42:
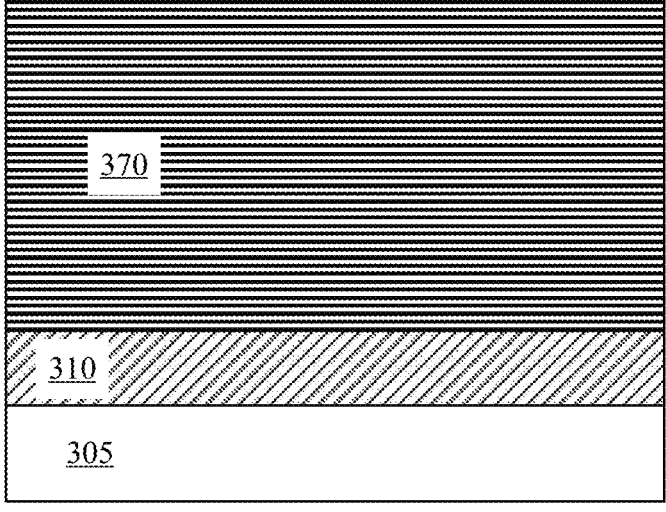
FIG. 42 illustrates a cross section $X_B$ of the gate cut region after the formation of the gate cut, in accordance with the embodiment of the present invention.

FIGS. 41, 42, 43 and 44 illustrate the process stage after gate cut 370 formation. FIG. 41 illustrates a cross section $X_A$ of the stacked device region after the formation of the gate cut 370, in accordance with the embodiment of the present invention. FIG. 42 illustrates a cross section $X_B$ of the gate cut region after the formation of the gate cut 370, in accordance with the embodiment of the present invention. As illustrated by FIG. 42, the columns of the gate 330, the gate cap 335, and the upper spacer 340 are removed. The interlayer dielectric 360 is also removed. The removal of these layers creates an empty space, where a dielectric fill is deposited to fill this space. The gate cut 370 is comprised of this dielectric fill material.

Figure 43:
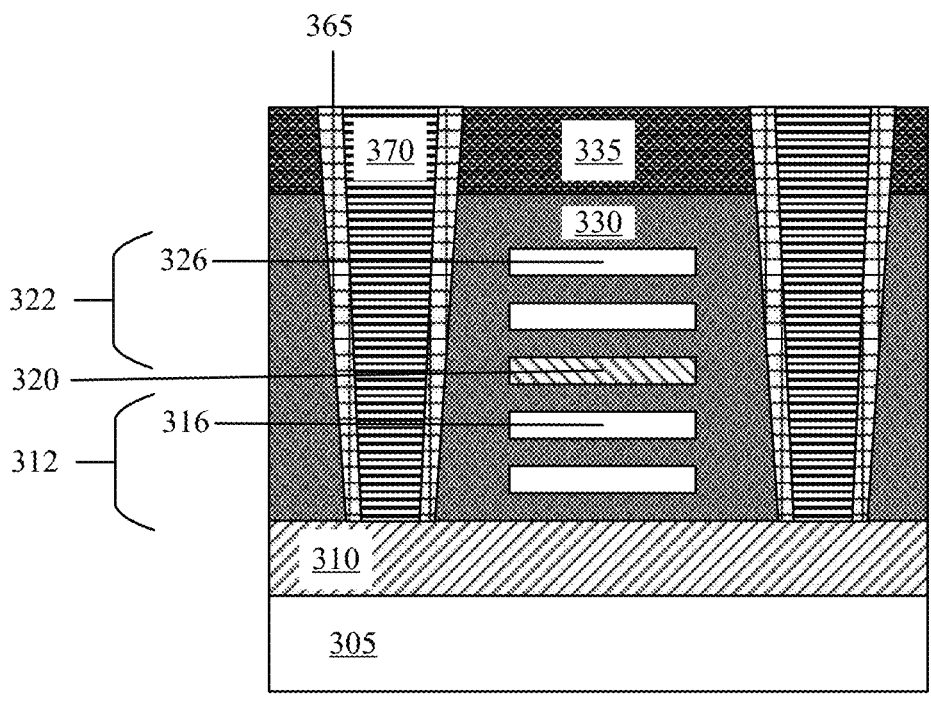
FIG. 43 illustrates a cross section $Y_A$ of the gate region after the formation of the gate cut, in accordance with the embodiment of the present invention.

FIG. 43 illustrates a cross section $Y_A$ of the gate region after the formation of the gate cut 370, in accordance with the embodiment of the present invention. A trench is cut into the gate 330 and the gate cap 335 to create the space for the gate cut 370. A dielectric liner 365 is formed on the exposed surfaces and etched back, so that only a portion of the dielectric liner 365 remains on the sidewalls of the trench. The dielectric fill is deposited in the remaining space within the trench to form the gate cut 370.

Figure 44:
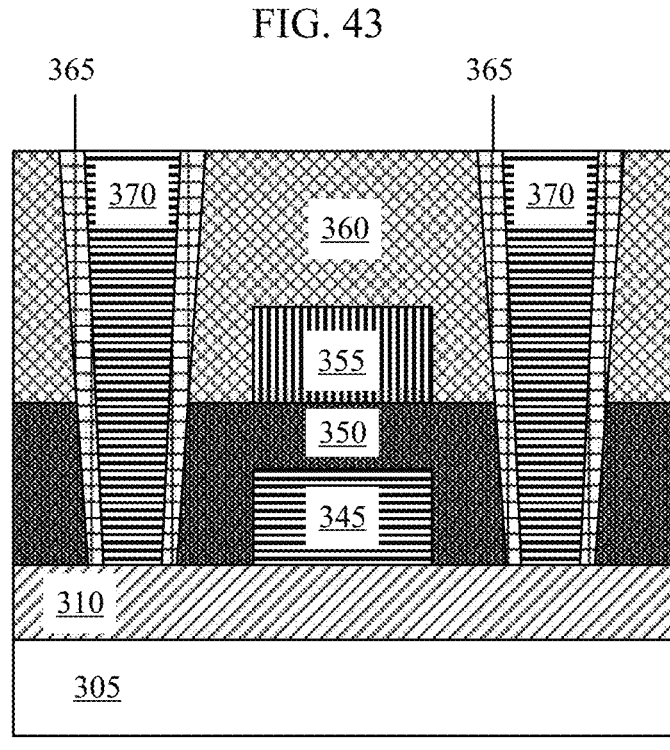
FIG. 44 illustrates a cross section $Y_B$ of the source/drain region after the formation of the gate cut, in accordance with the embodiment of the present invention.

FIG. 44 illustrates a cross section $Y_B$ of the source/drain region after the formation of the gate cut 370, in accordance with the embodiment of the present invention. A trench is cut into the middle isolation layer 350 and the interlayer dielectric 360 to create the space for the gate cut 370. A dielectric liner 365 is formed on the exposed surfaces and etched back, so that only a portion of the dielectric liner 365 remains on the sidewalls of the trench. The dielectric fill is deposited to fill the remaining space within the trench to form the gate cut 370.

Figure 45:
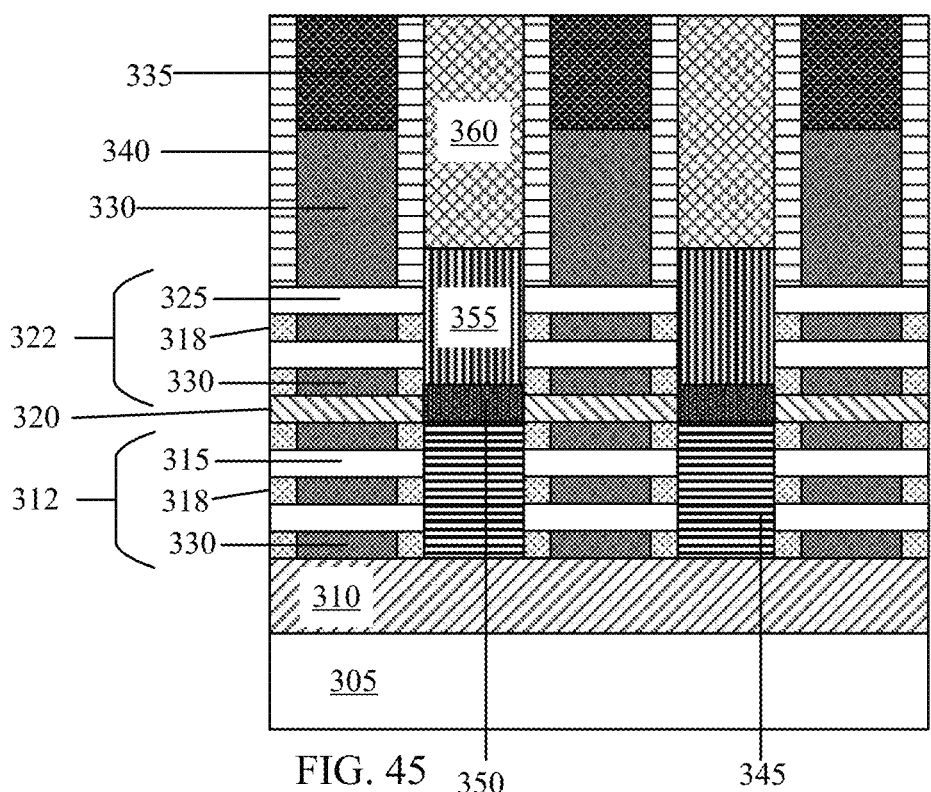
FIG. 45 illustrates a cross section $X_A$ of the stacked device region after the formation of the first section of the interconnect, in accordance with the embodiment of the present invention.
Figure 46:
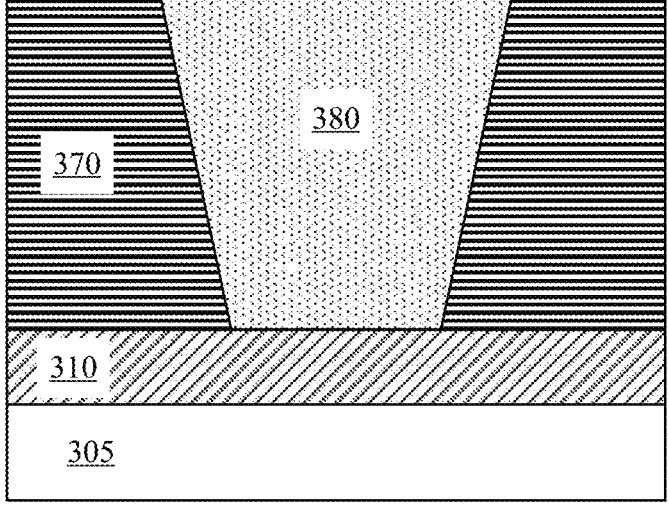
FIG. 46 illustrates a cross section $X_B$ of the gate cut region after the formation of the first section of the interconnect, in accordance with the embodiment of the present invention.
Figure 47:
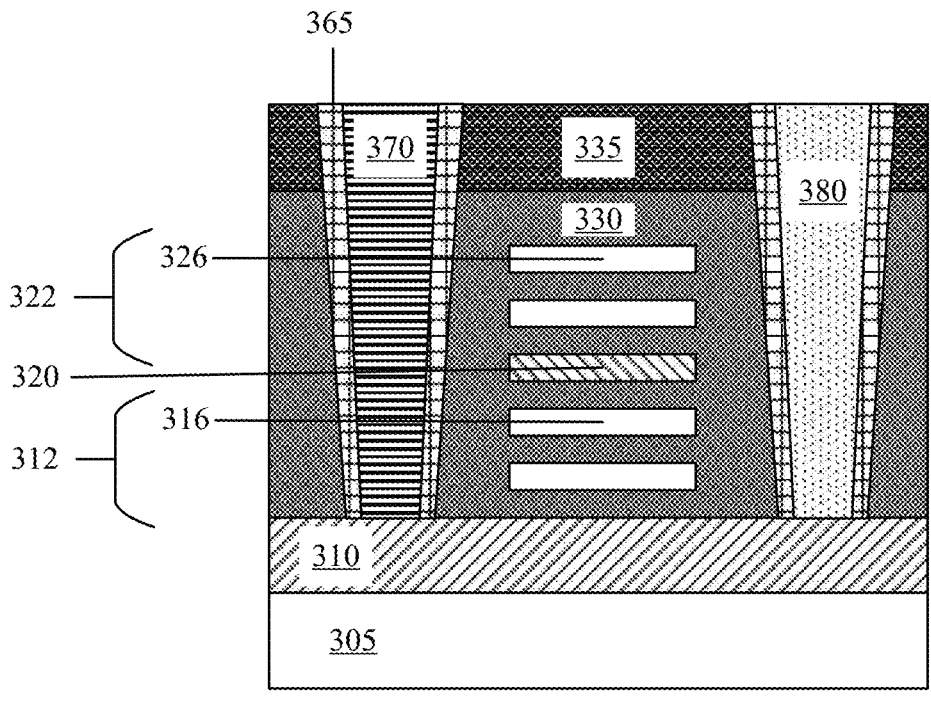
FIG. 47 illustrates a cross section $Y_A$ of the gate region after the formation of the first section of the interconnect, in accordance with the embodiment of the present invention.
Figure 48:
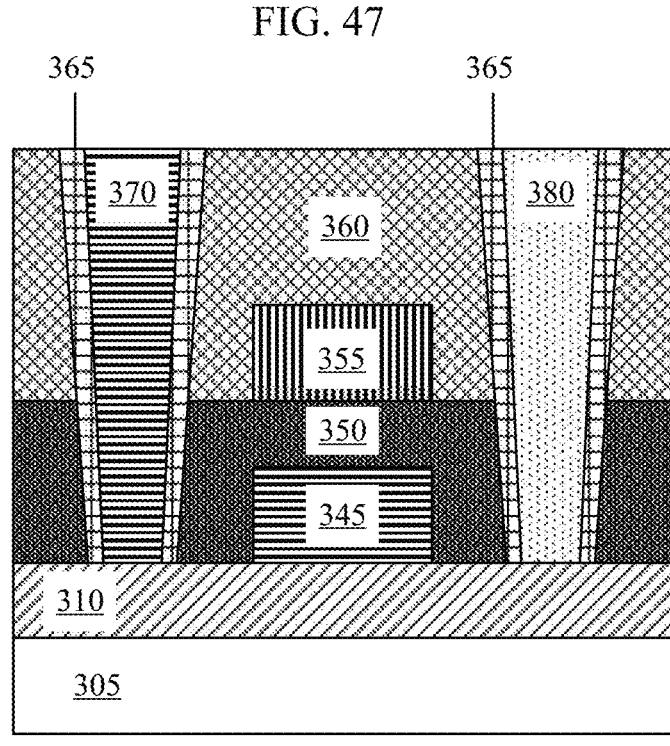
FIG. 48 illustrates a cross section $Y_B$ of the source/drain region after the formation of the first section of the interconnect, in accordance with the embodiment of the present invention.

FIGS. 45, 46, 47 and 48 illustrate the process stage after the formation of the first section of the interconnect 380, in accordance with the embodiment of the present invention. FIG. 45 illustrates a cross section $X_A$ of the stacked device region after the formation of the first section of the interconnect 380, in accordance with the embodiment of the present invention. FIG. 46 illustrates a cross section $X_B$ of the gate cut region after the formation of the first section of the interconnect 380, in accordance with the embodiment of the present invention. FIG. 47 illustrates a cross section $Y_A$ of the gate region after the formation of the first section of the interconnect 380, in accordance with the embodiment of the present invention. FIG. 48 illustrates a cross section $Y_B$ of the source/drain region after the formation of the first section of the interconnect 380, in accordance with the embodiment of the present invention. A trench is formed in the gate cut 370 by removing a portion of the gate cut 370. The first section of the interconnect 380 is formed by filling the trench in the gate cut 370 with a conductive metal.

Figure 49:
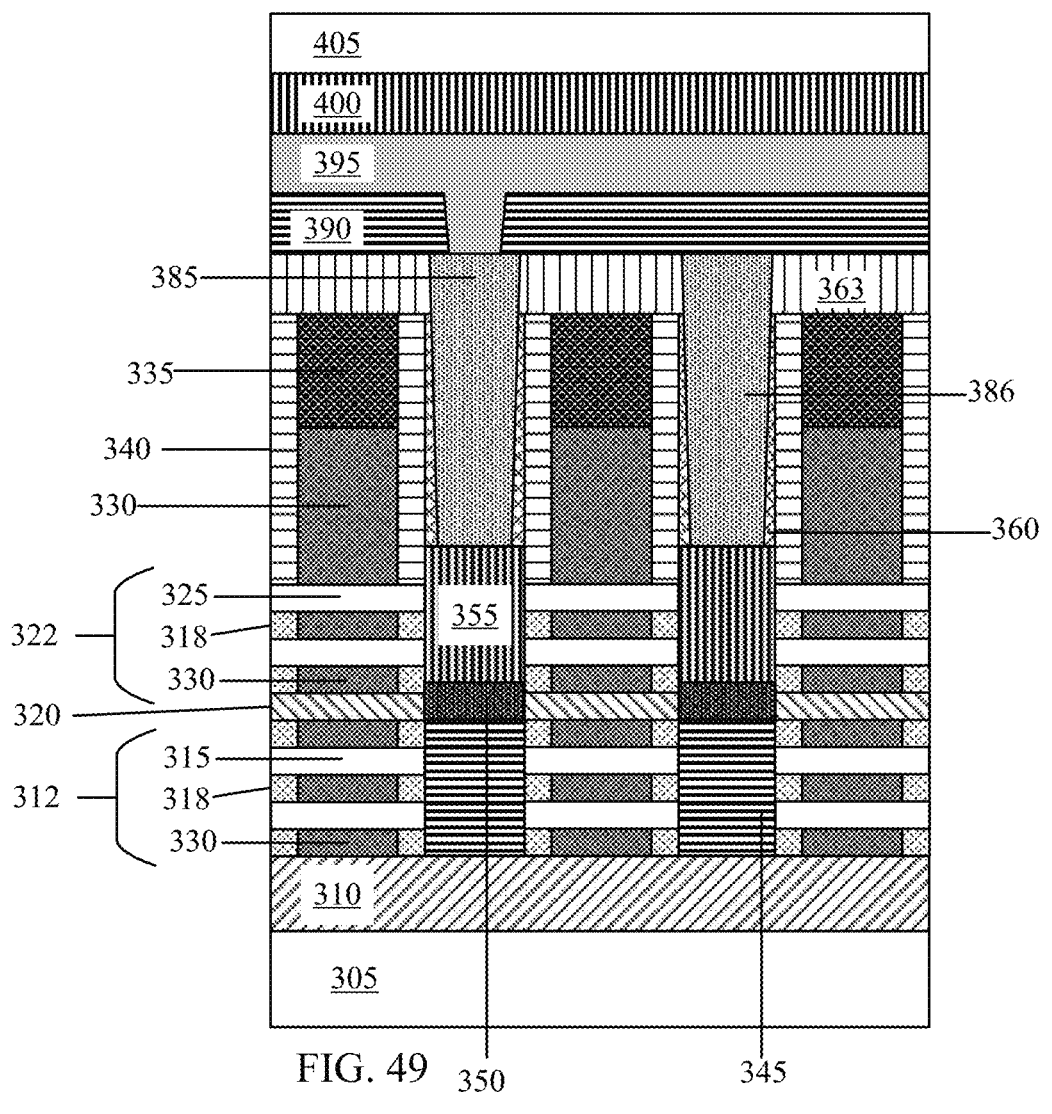
FIG. 49 illustrates a cross section $X_A$ of the stacked device region after the formation of the second section of the interconnect and formation of an upper contact, in accordance with the embodiment of the present invention.
Figure 50:
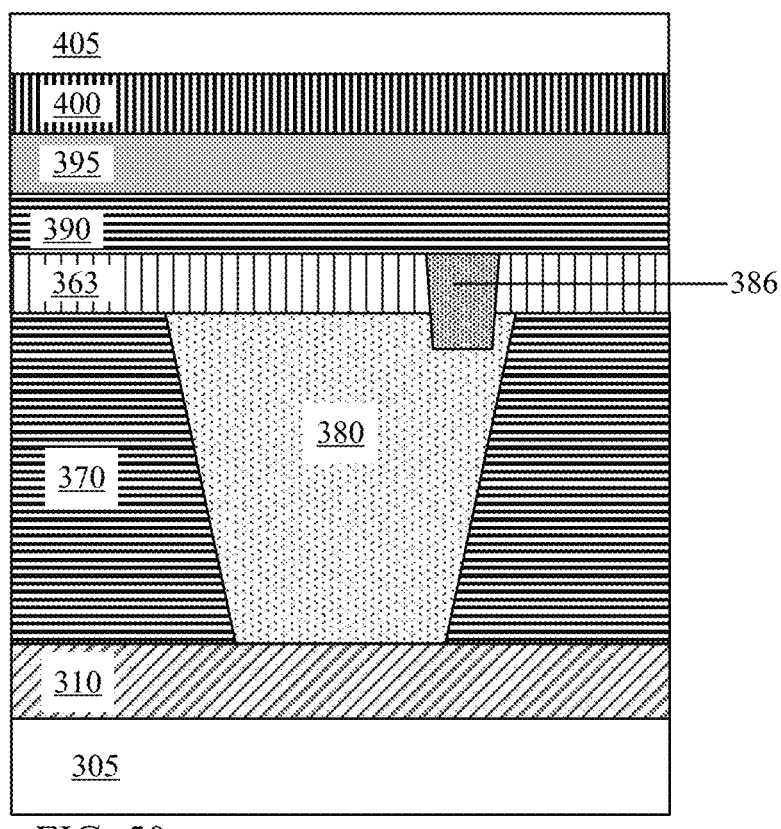
FIG. 50 illustrates a cross section $X_B$ of the gate cut region after the formation of the second section of the interconnect and formation of an upper contact, in accordance with the embodiment of the present invention.

FIGS. 49, 50, 51 and 52 illustrate the process stage after the formation of the MOL contact, 385, 386, 387, lower BEOL interconnect (M1-V0 395), additional BEOL 400, and bonding carrier wafer 405. FIG. 49 illustrates a cross section $X_A$ of the stacked device region after forming the second section of the interconnect 386 and forming an upper contact 385, BEOL (395 and 400), and carrier wafer 405, in accordance with the embodiment of the present invention. FIG. 50 illustrates a cross section $X_B$ of the gate cut region after the formation of the second section of the interconnect 386 and formation of an upper contact 385, BEOL (395 and 400), and carrier wafer 405, in accordance with the embodiment of the present invention.

An additional interlayer dielectric 363 is formed on top of the gate cap 335, the upper spacer 340, and the interlayer dielectric 360. One or more trenches are formed in the additional interlayer dielectric 363 and the interlayer dielectric 360 exposing the top surface of the upper source/drain 355. The trenches are filled with a conductive metal to form one or more upper contacts 385. One trench is filled with a conductive metal to form a second section of the interconnect 386. The second section of the interconnected 386 is in contact with the first section of the interconnect 380 as illustrated by FIG. 50. The second section of the interconnect 386 creates a direct connection between one of the upper source/drains 355 and the first section of the interconnect 380. Additional dielectric layer 390 is formed on top of the additional interlayer dielectric 363. A metal-via layer (M1-V0) 395 is formed in the dielectric layer 390 and M1-V0 395 connects to one or more upper contacts 385. The additional BEOL layer 400 is formed on top of the M1-V0 395 and a carrier wafer 405 is attached to the BEOL layer 400.

Figure 51:
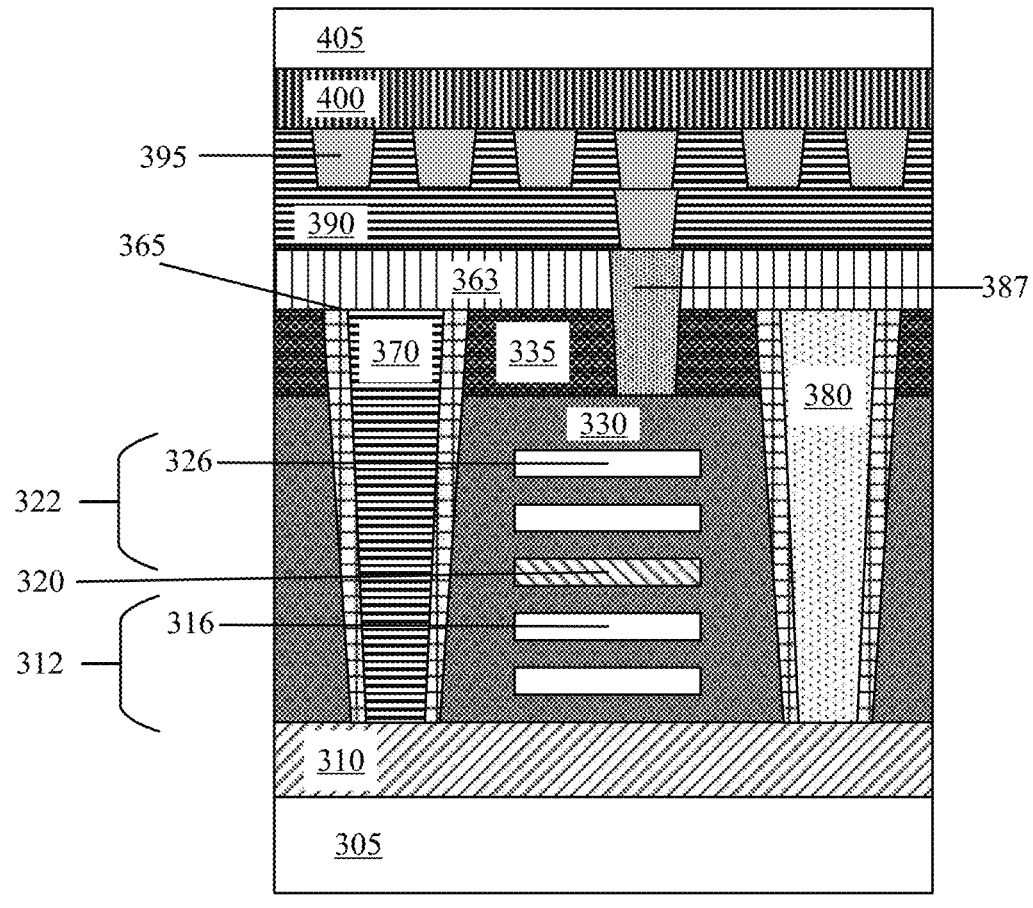
FIG. 51 illustrates a cross section $Y_A$ of the gate region after the formation of the gate contact, in accordance with the embodiment of the present invention.

FIG. 51 illustrates a cross section $Y_A$ of the gate region after the formation of gate contact 387, BEOL (395 and 400), and carrier wafer 405, in accordance with the embodiment of the present invention. An additional interlayer dielectric 363 is formed on top of the gate cap 335, dielectric liner 365, gate cut 370, and the first section of the interconnect 380. One or more trenches are formed in the additional interlayer dielectric 363 and the gate cap 335 exposing the top surface of the gate 330. The trenches are filled with a conductive metal to form one or more gate contact 387. Additional dielectric layer 390 is formed on top of the additional interlayer dielectric 363. A lower BEOL layer (M1-V0) 395 is formed in the additional dielectric layer 390 and the M1-V0 395 connects to one or more gate contacts 387. A backend of the line (BEOL) layer 400 is formed on top of the M1-V0 395 and a carrier wafer 405 is attached to the BEOL layer 400.

Figure 52:
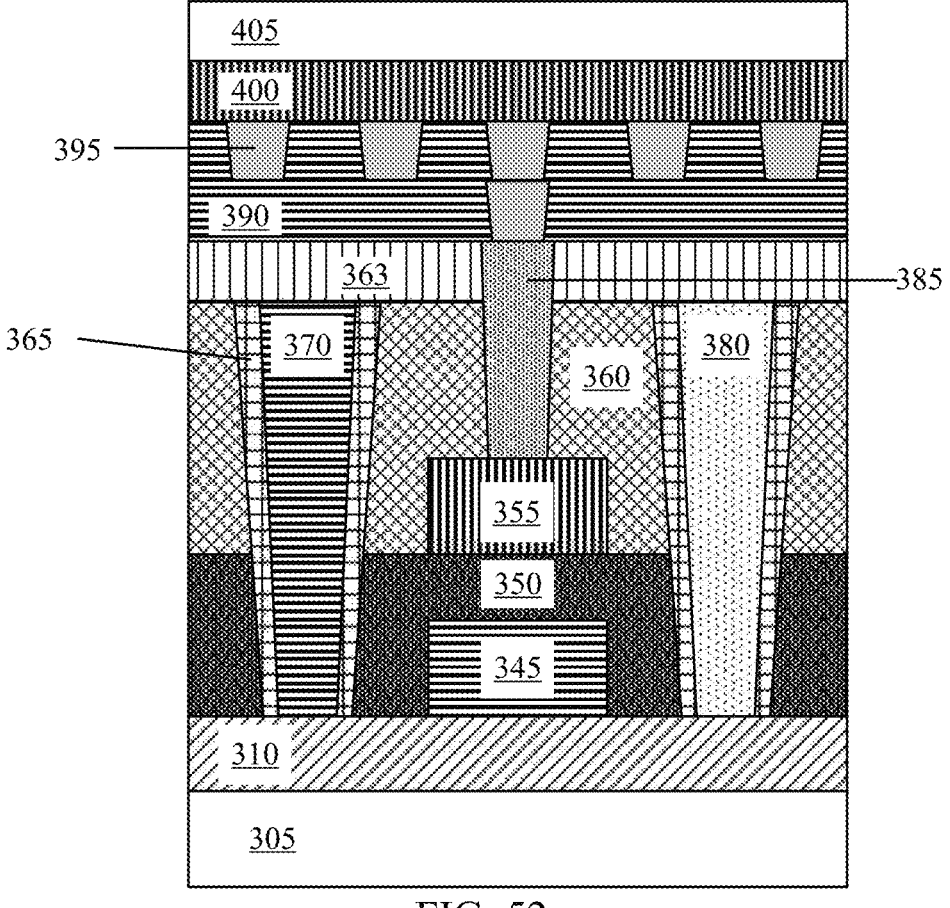
FIG. 52 illustrates a cross section $Y_B$ of the source/drain region after the formation of the second section of the interconnect and formation of an upper contact, in accordance with the embodiment of the present invention.

FIG. 52 illustrates a cross section $Y_B$ of the source/drain region after the formation of the second section of the interconnect and formation of an upper contact, BEOL (395 and 400), and carrier wafer 405, in accordance with the embodiment of the present invention. An additional interlayer dielectric 363 is formed on top of the dielectric liner 365, the gate cut 370, the interlayered dielectric 360, and the first section of the interconnect 380. One or more trenches are formed in the additional interlayer dielectric 363 and the interlayer dielectric 360 exposing the top surface of the upper source/drain 355. The trenches are filled with a conductive metal to form one or more upper contacts 385. Additional dielectric layer 390 is formed on top of the additional interlayer dielectric 363. A lower BEOL layer (M1-V0) 395 is formed on top of the dielectric layer 390 and the M1-V0 395 connects to one or more upper contacts 385. A backend of the line (BEOL) layer 400 is formed on top of the metal layer 395 and a carrier wafer 405 is attached to the BEOL layer 400.

Figure 53:
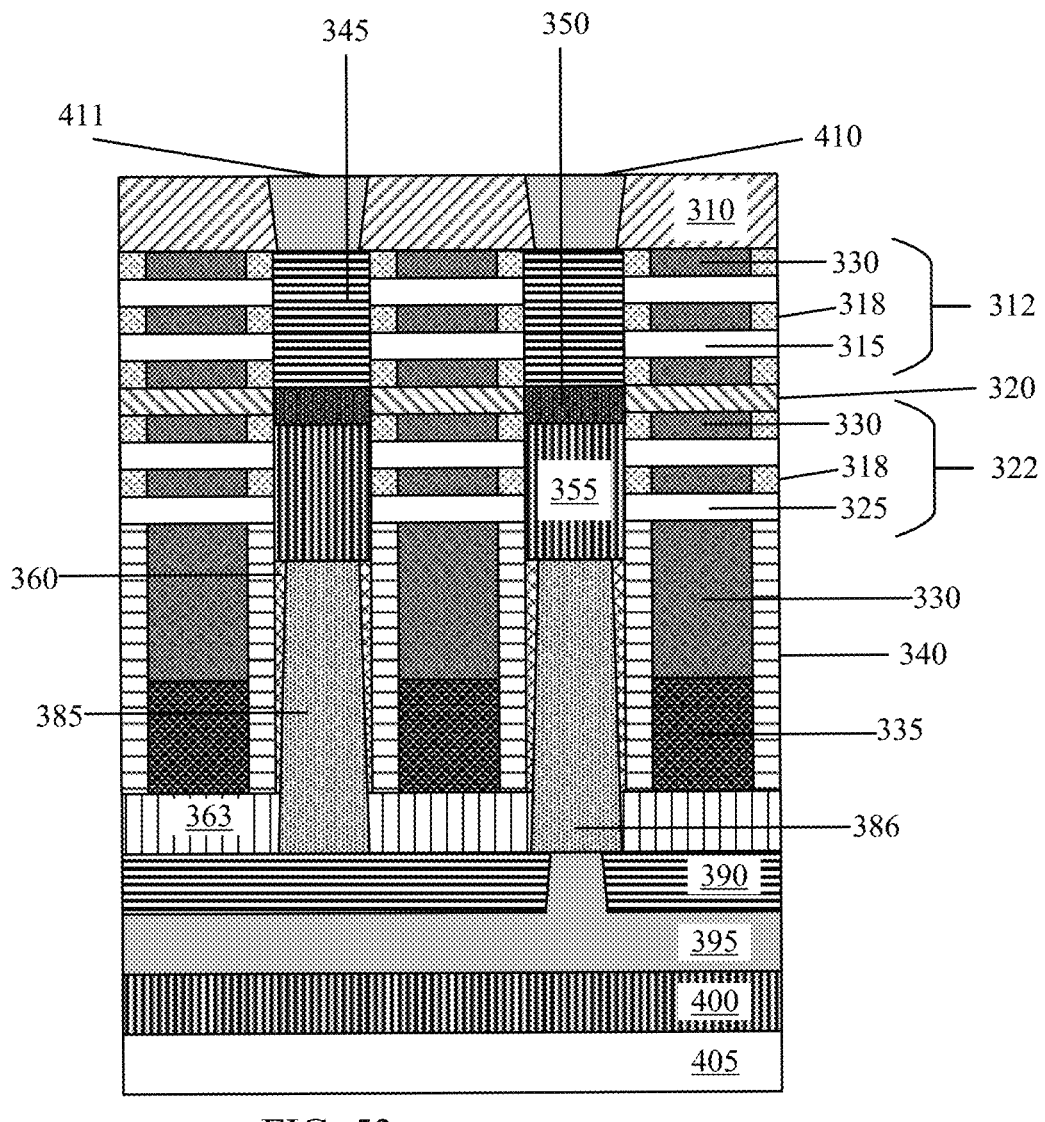
FIG. 53 illustrates a cross section $X_A$ of the stacked device region after flipping the stacked for backside processing and the formation of the third section of the interconnect and formation of a bottom contact, in accordance with the embodiment of the present invention.
Figure 54:
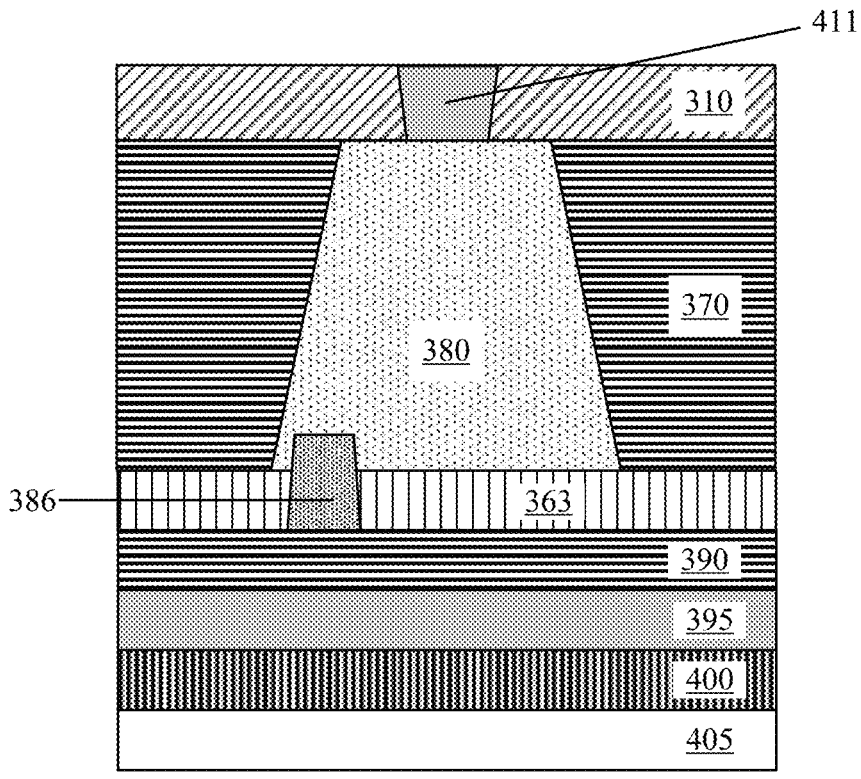
FIG. 54 illustrates a cross section $X_B$ of the gate cut region after flipping the stacked for backside processing and the formation of the third section of the interconnect and formation of a bottom contact, in accordance with the embodiment of the present invention.

FIGS. 53, 54, 55 and 56 illustrate the process stage after flipping the stacked for backside processing and the formation of the third section of the interconnect 411 and formation of a bottom contact 410, in accordance with the embodiment of the present invention. FIG. 53 illustrates a cross section $X_A$ of the stacked device region after flipping the stacked for backside processing and the formation of the third section of the interconnect 411 and formation of a bottom contact 410, in accordance with the embodiment of the present invention. FIG. 54 illustrates a cross section $X_B$ of the gate cut region after flipping the stacked for backside processing and the formation of the third section of the interconnect 411 and formation of a bottom contact 410, in accordance with the embodiment of the present invention.

Figure 55:
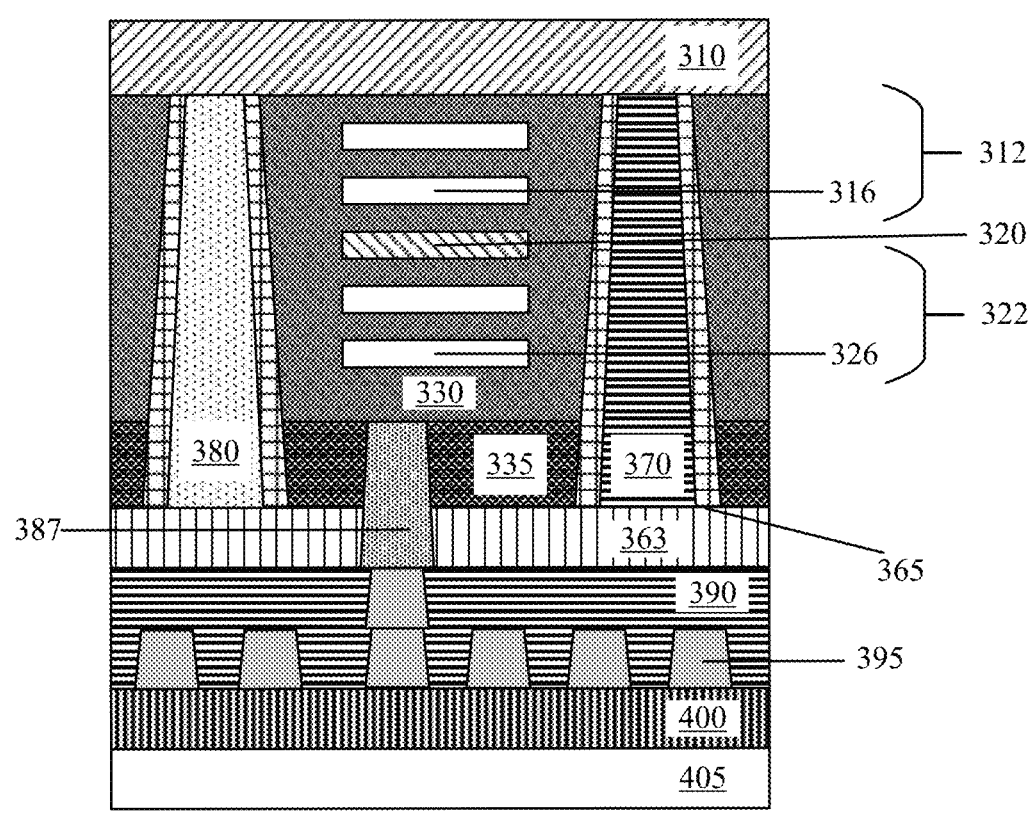
FIG. 55 illustrates a cross section $Y_A$ of the gate region after flipping the stacked for backside processing and the formation of the third section of the interconnect and formation of a bottom contact, in accordance with the embodiment of the present invention.
Figure 56:
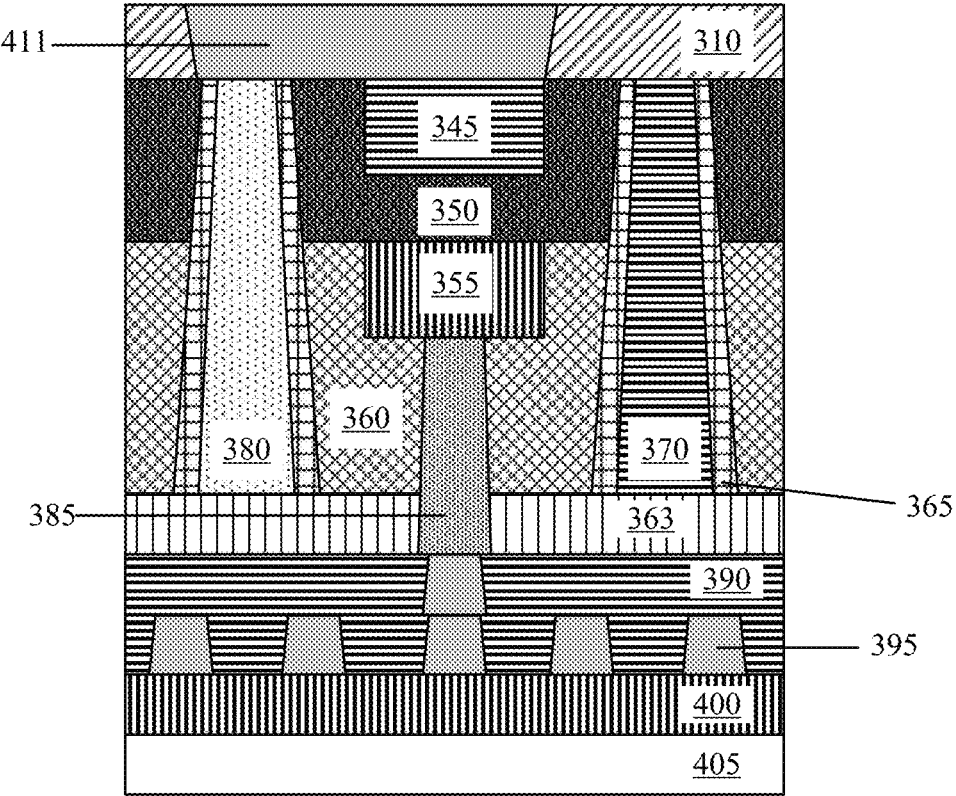
FIG. 56 illustrates a cross section $Y_B$ of the source/drain region after flipping the stacked for backside processing and the formation of the third section of the interconnect and formation of a bottom contact, in accordance with the embodiment of the present invention.

FIG. 55 illustrates a cross section $Y_A$ of the gate region after flipping the stacked for backside processing and the formation of the third section of the interconnect 411 and formation of a bottom contact 410, in accordance with the embodiment of the present invention. FIG. 56 illustrates a cross section $Y_B$ of the source/drain region after flipping the stacked for backside processing and the formation of the third section of the interconnect 411 and formation of a bottom contact 410, in accordance with the embodiment of the present invention.

The stacked device is flipped over to allow for the backside processing of the stacked device. The substrate 305 is removed to expose the oxide layer 310. One or more trenches are formed in the oxide layer 310 to expose a surface of the bottom source/drain 345. The trenches are filled with a conductive metal to form one or more bottom contacts 410. One trench is filled with a conductive metal to form a third section of the interconnect 411. The third section of the interconnected 411 is in contact with the first section of the interconnect 380 as illustrated by FIG. 54. The third section of the interconnect 411 creates a direct connection between one of the bottom source/drains 345 and the first section of the interconnect 380. Furthermore, the bottom source/drain 345 is connected to the upper source/drain 355 through the sections of the interconnect (i.e., the third section of the interconnect 411, the first section of the interconnect 380, and the second section of the interconnect 386).

Figure 57:
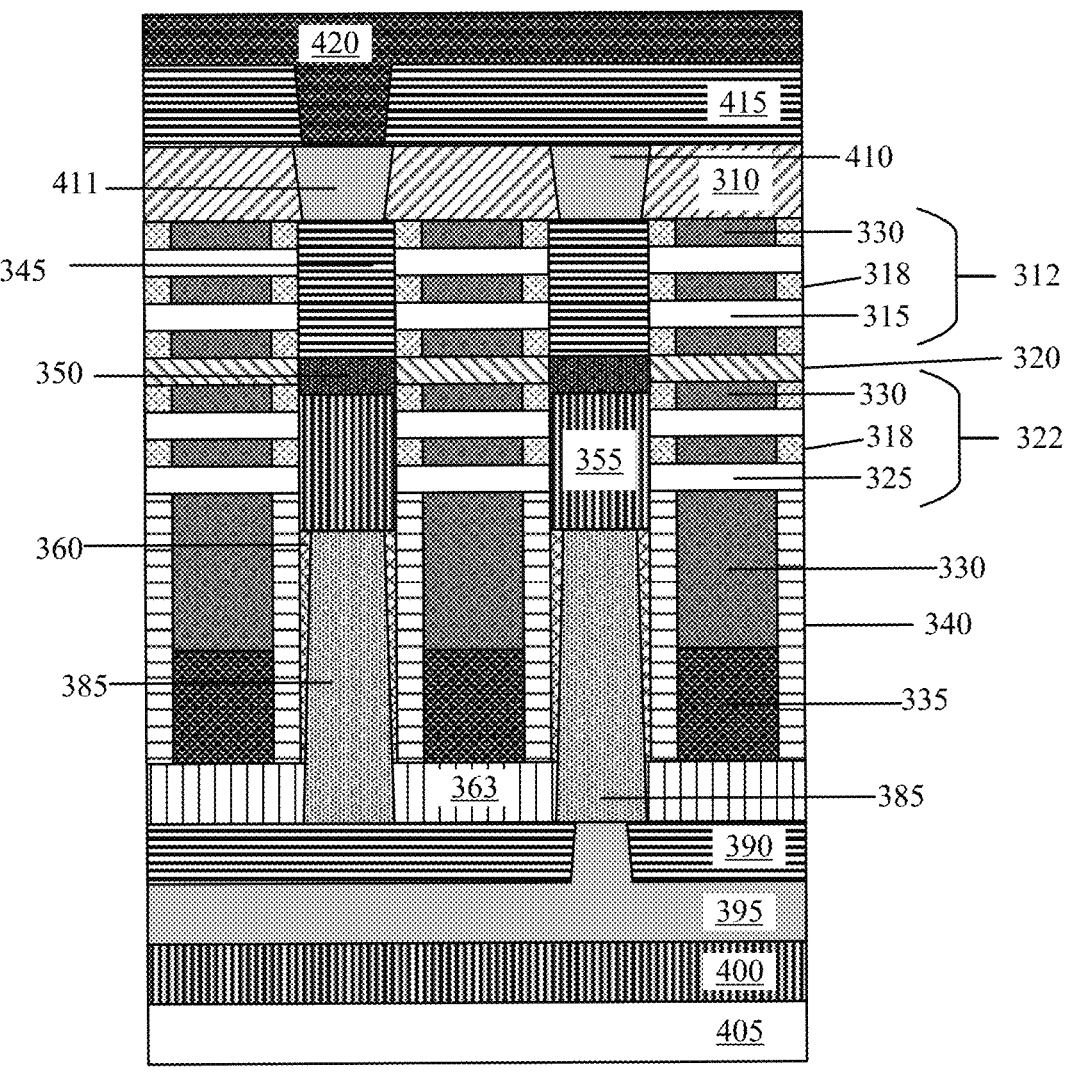
FIG. 57 illustrates a cross section $X_A$ of the stacked device region after the formation of a backside power distribution network, in accordance with the embodiment of the present invention.

FIGS. 57, 58, 59 and 60 illustrate the process stage after the formation of a backside power distribution network 420, in accordance with the embodiment of the present invention. FIG. 57 illustrates a cross section $X_A$ of the stacked device region after the formation of a backside power distribution network 420, in accordance with the embodiment of the present invention. A dielectric layer 415 is formed on top of the oxide layer 310, the bottom contact 410, and on top of the third section of the interconnect 311. A backside power distribution network 420 is formed on top and in the dielectric layer 415, where the backside power distribution network 420 can be connected to the third section of the interconnect 411 and/or a bottom contact 410.

Figure 58:
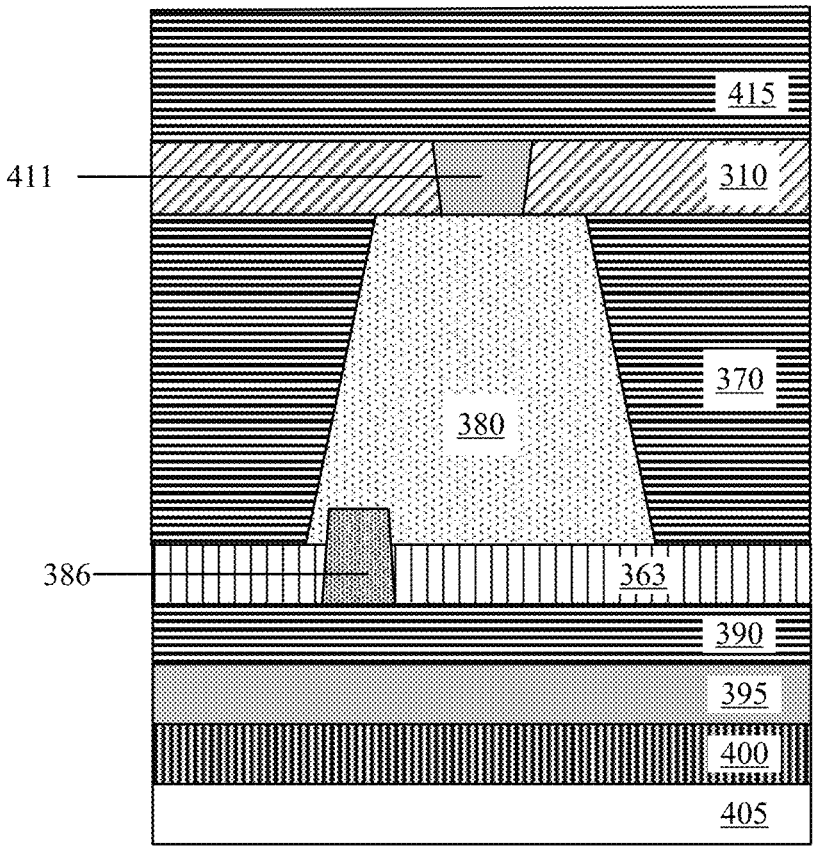
FIG. 58 illustrates a cross section $X_B$ of the gate cut region after the formation of a backside power distribution network, in accordance with the embodiment of the present invention.

FIG. 58 illustrates a cross section $X_B$ of the gate cut region after the formation of a backside power distribution network 420, in accordance with the embodiment of the present invention. A dielectric layer 415 is formed on top of the oxide layer 310, the bottom contact 410, and on top of the third section of the interconnect 311. A backside power distribution network 420 is formed on top and in the dielectric layer 415, where the backside power distribution network 420 can be connected to the third section of the interconnect 411 and/or a bottom contact 410.

Figure 59:
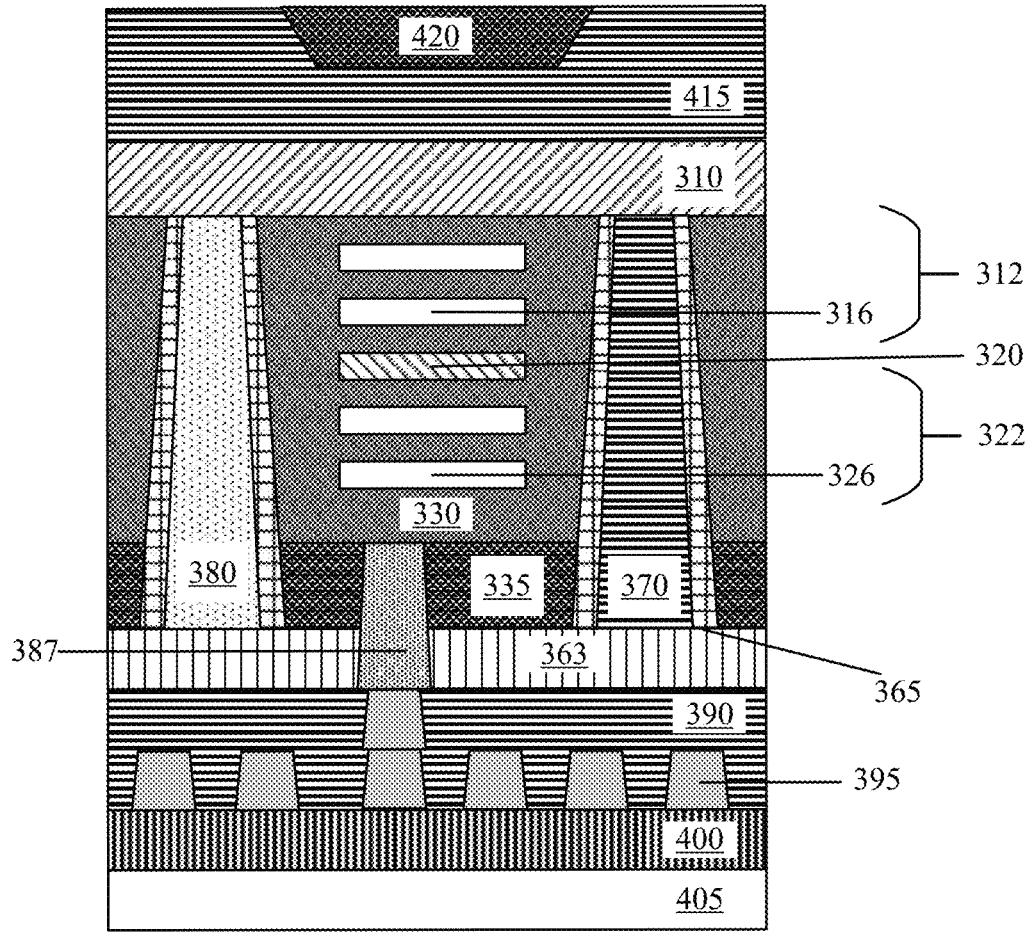
FIG. 59 illustrates a cross section $Y_A$ of the gate region after the formation of a backside power distribution network, in accordance with the embodiment of the present invention.

FIG. 59 illustrates a cross section $Y_A$ of the gate region after the formation of a backside power distribution network 420, in accordance with the embodiment of the present invention. A dielectric layer 415 is formed on top of the oxide 310, the bottom contact 410, and on top of the third section of the interconnect 311. A backside power distribution network 420 is formed on top and in the dielectric layer 415, where the backside power distribution network 420 can be connected to the third section of the interconnect 411 and/or a bottom contact 410.

Figure 60:
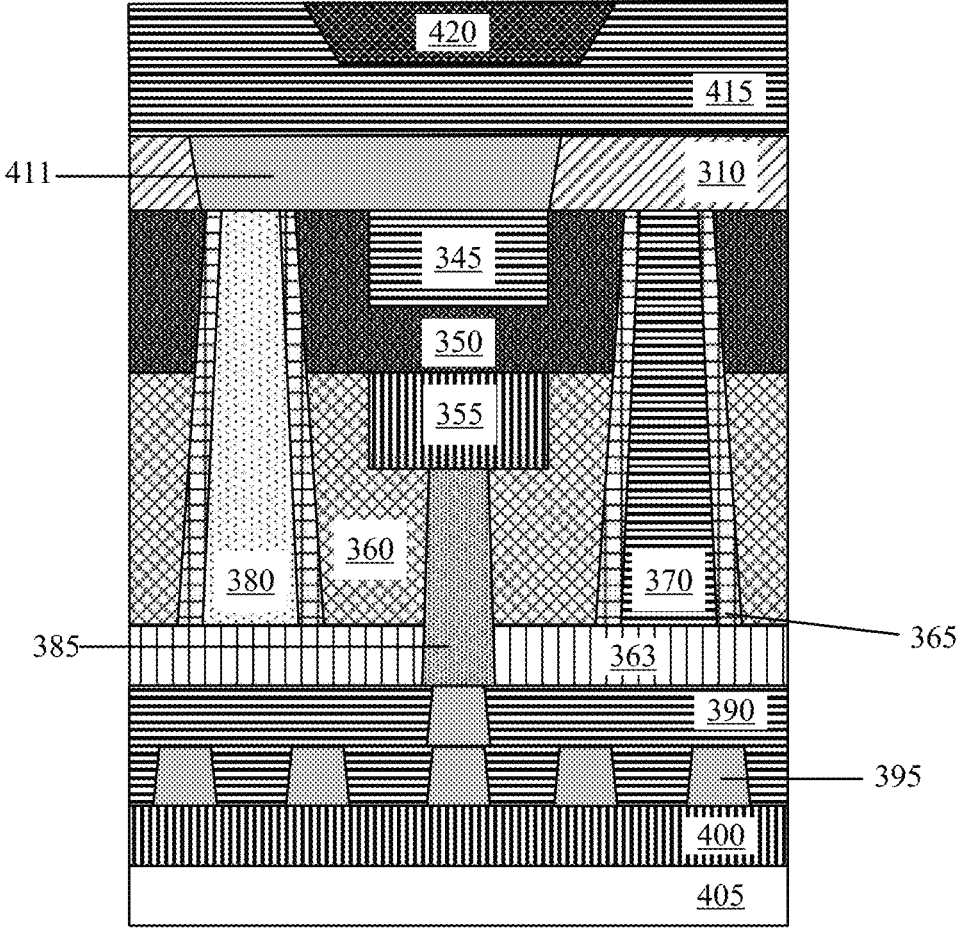
FIG. 60 illustrates a cross section $Y_B$ of the source/drain region after the formation of a backside power distribution network, in accordance with the embodiment of the present invention.

FIG. 60 illustrates a cross section $Y_B$ of the source/drain region after the formation of a backside power distribution network 420, in accordance with the embodiment of the present invention. A dielectric layer 415 is formed on top of the oxide 310, the bottom contact 410, and on top of the third section of the interconnect 311. A backside power distribution network 420 is formed on top and in the dielectric layer 415, where the backside power distribution network 420 can be connected to the third section of the interconnect 411 and/or a bottom contact 410.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic device comprising:
   a stacked device region, wherein the stacked device region is comprised of a plurality of top devices and a plurality of bottom devices, wherein the plurality of top devices are located on different vertical levels than the plurality of bottom devices, wherein each of the plurality of top devices includes at least one top source/drain, and wherein each of the plurality of bottom devices includes at least one bottom source/drain;
   a gate cut region located adjacent to the stacked region and extends parallel to the stacked device region; and
   an interconnect located in the gate cut region, wherein the interconnect is connected to at least two different devices that are located laterally adjacent in the stacked device region.

2. The microelectronic device of claim 1, wherein the at least two different devices connected to the interconnected are a first bottom source/drain and a second bottom source/drain.

3. The microelectronic device of claim 2, where the first bottom source/drain and the second bottom source/drain are adjacent to each other.

4. The microelectronic device of claim 2, further comprising at least one bottom source/drain located between the first bottom source/drain and the second bottom source/drain.

5. The microelectronic device of claim 1, wherein the at least two different devices connected to the interconnected are a first upper source/drain and a second upper source/drain.

6. The microelectronic device of claim 5, where the first upper source/drain and the second upper source/drain are adjacent to each other.

7. The microelectronic device of claim 5, further comprising at least one upper source/drain located between the first upper source/drain and the second upper source/drain.

8. The microelectronic device of claim 1, wherein the at least two different devices connected to the interconnected are a first bottom source/drain and a first upper source/drain.

9. The microelectronic device of claim 8, where the first bottom source/drain and the first bottom source/drain are adjacent to each other.

10. The microelectronic device of claim 8, further comprising at least one bottom source/drain located between a location of the first bottom source/drain and a location of the first upper source/drain.

11. A microelectronic device comprising:
    a first stacked device region, wherein the first stacked device region is comprised of a plurality of first top devices and a first plurality of bottom devices, wherein the plurality of first top devices are located on different vertical levels than the first plurality of bottom devices, wherein each of the plurality of first top devices includes at least one first top source/drain, and wherein each of the plurality of first bottom devices includes at least one first bottom source/drain;
    a second stacked device region, wherein the second stacked device region is comprised of a plurality of second top devices and a second plurality of bottom devices, wherein the plurality of second top devices are located on different vertical levels than the second plurality of bottom devices wherein each of the plurality of second top devices includes at least one second top source/drain, and wherein each of the second plurality of bottom devices includes at least one second bottom source/drain;
    a gate cut region located between the first stacked device region and the second stacked device region, wherein the gate cut region extends parallel to the first stacked device region and the second stacked device region; and
    an interconnect located in the gate cut region, wherein the interconnect is connected to at least devices located in the first stacked device region and at least one device located in the second stacked device region.

12. The microelectronic device of claim 11, wherein the at least one device located in the first stacked device region is a first bottom source/drain and the at least one device located in the second stacked device region a second bottom source/drain.

13. The microelectronic device of claim 11, wherein the at least one device located in the first stacked device region is a first upper source/drain and the at least one device located in the second stacked device region a second bottom source/drain.

14. The microelectronic device of claim 11, wherein the at least one device located in the first stacked device region is a first upper source/drain and the at least one device located in the second stacked device region a second upper source/drain.

15. The microelectronic device of claim 11, wherein the interconnected is connected to a plurality of devices located in the first stacked device region and a plurality of devices located in the second stacked device region.

16. The microelectronic device of claim 15, wherein the plurality of devices located in the first stacked device region includes at least first bottom source/drain and at least one first upper source/drain.

17. The microelectronic device of claim 16, wherein the plurality of devices located in the second stacked device region includes at least second bottom source/drain and at least one second upper source/drain.

18. A method comprising:
    forming a first stacked device region, wherein the first stacked device region is comprised of a plurality of first top devices and a first plurality of bottom devices, wherein each of the plurality of first top devices includes at least one first top source/drain, and wherein each of the plurality of first bottom devices includes at least one first bottom source/drain;

forming a second stacked device region, wherein the second stacked device region is comprised of a plurality of second top devices and a second plurality of bottom devices, wherein each of the plurality of second top devices includes at least one second top source/drain, and wherein each of the plurality of second bottom devices includes at least one second bottom source/drain;

forming a gate cut region located between the first stacked device region and the second stacked device region, wherein the gate cut region extends parallel to the first stacked device region and the second stacked device region; and forming an interconnect located in the gate cut region, wherein the interconnect is connected to at least two different source/drains.

19. The method of claim 18, wherein the interconnect connects at least two different source/drains located in the first stacked device region.

20. The method of claim 18, wherein the interconnect connects one source/drain located in the first stacked device region and one source/drain located in the second stacked device region.

\*　\*　\*　\*　\*